(12) United States Patent
Rajan et al.

(10) Patent No.: US 9,559,314 B2
(45) Date of Patent: Jan. 31, 2017

(54) LAMP WITH MULTIPLE FLEXIBLE OLEDS

(75) Inventors: Kamala Rajan, Ewing, NJ (US);
Emory Krall, Ewing, NJ (US);
Prashant Mandlik, Ewing, NJ (US);
Ruiqing Ma, Ewing, NJ (US); Peter Levermore, Ewing, NJ (US); Huiqing Pang, Ewing, NJ (US); Jeffrey Silvernail, Ewing, NJ (US)

(73) Assignee: Universal Display Corporation, Ewing, NJ (US)

( * ) Notice: Subject to any disclaimer, the term of this patent is extended or adjusted under 35 U.S.C. 154(b) by 22 days.

(21) Appl. No.: 14/347,908

(22) PCT Filed: Sep. 29, 2011

(86) PCT No.: PCT/US2011/054093
§ 371 (c)(1),
(2), (4) Date: Mar. 27, 2014

(87) PCT Pub. No.: WO2013/048419
PCT Pub. Date: Apr. 4, 2013

(65) Prior Publication Data
US 2014/0231793 A1    Aug. 21, 2014

(51) Int. Cl.
*H01L 29/08* (2006.01)
*H01L 35/24* (2006.01)
(Continued)

(52) U.S. Cl.
CPC ............ *H01L 51/0097* (2013.01); *F21S 6/003* (2013.01); *H01L 51/52* (2013.01); *H01R 12/61* (2013.01); *H01R 13/7175* (2013.01); *H05K 1/147* (2013.01); *H05K 1/189* (2013.01); *F21Y 2105/00* (2013.01); *F21Y 2115/15* (2016.08); *H01L 27/3202* (2013.01); *H01L 27/3204* (2013.01); *H01L 2251/5361* (2013.01);
(Continued)

(58) Field of Classification Search
CPC ..... H01L 51/0097; H01L 51/52; H05K 1/189; H05K 1/147; F21S 6/003; H01R 12/61; H01R 13/7175
See application file for complete search history.

(56) References Cited

U.S. PATENT DOCUMENTS 4,769,292 A    9/1988 Tang et al.
5,247,190 A    9/1993 Friend et al.
(Continued)

FOREIGN PATENT DOCUMENTS

WO    2008057394    5/2008
WO    2010011390    1/2010
WO    2011075730 A2    6/2011

OTHER PUBLICATIONS

Baldo, et al., "Highly efficient phosphorescent emission from organic electroluminescent devices", Nature, vol. 395, pp. 151-154, 1998.
(Continued)

*Primary Examiner* — Stephen W Smoot
*Assistant Examiner* — Vicki B Booker
(74) *Attorney, Agent, or Firm* — Morris & Kamlay LLP

(57) ABSTRACT

Devices including multiple flexible substrates bearing organic light-emitting diodes (OLEDs) are provided. The flexible substrates are interconnected, and the properties of the substrates and the interconnections provide the shape of the device.

14 Claims, 26 Drawing Sheets

(51) Int. Cl.
*H01L 51/00* (2006.01)
*H05K 1/14* (2006.01)
*H05K 1/18* (2006.01)
*F21S 6/00* (2006.01)
*H01R 12/61* (2011.01)
*H01R 13/717* (2006.01)
*H01L 51/52* (2006.01)
*H05K 1/02* (2006.01)
*H05K 3/28* (2006.01)
*H05K 3/36* (2006.01)
*H01L 27/32* (2006.01)
*F21Y 105/00* (2016.01)

(52) U.S. Cl.
CPC ............ *H05K 1/028* (2013.01); *H05K 3/284* (2013.01); *H05K 3/361* (2013.01); *H05K 2201/10106* (2013.01); *H05K 2201/10393* (2013.01); *H05K 2201/209* (2013.01); *H05K 2201/2072* (2013.01); *Y02E 10/549* (2013.01)

(56) References Cited

U.S. PATENT DOCUMENTS

| | | | |
|---|---|---|---|
| 5,559,681 A | 9/1996 | Duarte | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 6,771,021 B2 | 8/2004 | Cok et al. | |
| 7,075,226 B2 | 7/2006 | Cok et al. | |
| 7,279,704 B2 | 10/2007 | Walters et al. | |
| 7,431,968 B1 | 10/2008 | Shtein et al. | |
| 7,968,146 B2 | 6/2011 | Wagner et al. | |
| 8,007,286 B1* | 8/2011 | Holec et al. | 439/65 |
| 8,115,370 B2* | 2/2012 | Huang | F21K 9/00 313/317 |
| 8,764,239 B2 | 7/2014 | Burrows et al. | |
| 8,773,013 B2 | 7/2014 | Rajan et al. | |
| 8,907,560 B2 | 12/2014 | Rajan et al. | |
| 2003/0098647 A1* | 5/2003 | Silvernail | H01L 51/5237 313/506 |
| 2003/0230980 A1 | 12/2003 | Forrest et al. | |
| 2004/0174116 A1 | 9/2004 | Lu et al. | |
| 2008/0233287 A1 | 9/2008 | Shtein et al. | |
| 2010/0295032 A1 | 11/2010 | Kwong et al. | |
| 2011/0057559 A1 | 3/2011 | Xia et al. | |

OTHER PUBLICATIONS

Baldo, et al., "Very high-efficiency green organic light-emitting devices based on electrophosphorescence", Applied Physics Letters, vol. 75, No. 1, pp. 4-6, Jul. 5, 1999.

European Patent Office, "International Search Report and Written Opinion", issued in PCT/US2011/054093, Jun. 19, 2012.

oled-display.net, "GE and Konica Minolta to Show the World's first flexible OLED lighting panels in a table lamp", OLED-Display.net, available at http://www.oled-display.net/ge-and-konica-minolta-to-show-the-worlds-first-flexible-oled-lighting-panels-in-a-table-lamp, visited Jul. 19, 2011, Jul. 19, 2011.

Pilloton, "Organic LED Lamp by Makoto Tojiki", Inhabitat, available at 6. http://inhabitat.com/organic-led-lamp-by-makoto-tojiki, visited Jul. 19, 2011, May 29, 2007.

* cited by examiner

A.

B.

C.

(a)

(b)

(c)

A.

B.

LAMP WITH MULTIPLE FLEXIBLE OLEDS

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting device (OLED) lighting, in particular to flexible OLED lighting.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

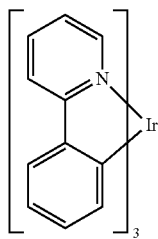

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

A first device comprising a plurality of flexible substrates is provided. The plurality of flexible substrates include at least a first flexible substrate and a second flexible substrate. The first flexible substrate has at least one flexible organic light emitting device (OLED) deposited thereon. There is at least one interconnection between the first flexible substrate and the second flexible substrate, and the interconnection is not directly attached to a fixture.

In one aspect, the second flexible substrate has at least one flexible organic light emitting device (OLED) deposited thereon.

In one aspect, the first flexible substrate is directly supported only by interconnections with other flexible substrates.

In one aspect, the shape of the first flexible substrate is defined by the mechanical properties of the plurality of flexible substrates and the interconnections between the plurality of flexible substrates. In another aspect, the shape of the first device is defined by the mechanical properties of the plurality of flexible substrates and the interconnections between the plurality of flexible substrates. In yet another aspect, the shape of the first device is not defined by any fixture.

In one aspect, the first flexible substrate is electrically connected to the second flexible substrate through the at least one interconnection.

In one aspect, the at least one interconnection between the first flexible substrate and the second flexible substrate is a direct connection, without a connecting element. Preferably, the at least one interconnection is one or more of a folded interconnect, an interlocked cut, a hook and eye system, adhesive, conductive adhesive, a soldered connection or a welded connection.

In one aspect, the at least one interconnection between the first flexible substrate and the second flexible substrate is an indirect connection through a connecting element that is not the first flexible substrate or the second flexible substrate. Preferably, the at least one interconnection is one or more of tape, conductive tape, a rivet, a hook and eye system, and a snap-connect. In one aspect, the snap connect is formed on the flexible substrate. In another aspect, the snap connect is fixed to the flexible substrate.

The interconnection between the first flexible substrate and the second flexible substrate may use a clamping element. In one aspect, the at least one interconnection between the first flexible substrate and the second flexible substrate is an indirect connection and uses a clamping element that is not the first flexible substrate or the second flexible substrate. In another aspect, the at least one interconnection between the first flexible substrate and the second flexible substrate is a direct connection and uses a clamping element that is not the first flexible substrate or the second flexible substrate. Preferably, the clamping element is one or more of a clip, a magnet, and a clamp.

In one aspect, the at least one interconnection is temporary. In another aspect, the at least one interconnection is permanent.

In another aspect, the first device comprises at least one structurally weakened region. In one aspect, the structurally weakened region comprises a cut region. In another aspect, the structurally weakened region comprises a scored region.

In yet another aspect, the structurally weakened region comprises a perforated region. In a further aspect, the structurally weakened region comprises a fold. In one aspect, at least one structurally weakened region is formed prior to OLED deposition. In another aspect, the OLED is not deposited on the structurally weakened region.

In one aspect, the first flexible substrate is adjacent to the second flexible substrate. One or more regions of the first flexible substrate and one or more regions of the second flexible substrate are folded, and the one or more folded regions of the first flexible substrate are connected to the one or more folded regions of the second flexible substrate. In another aspect, the one or more regions of the first flexible substrate and the one or more regions of the second flexible substrate are scored prior to folding.

In yet another aspect, the one or more regions of the first flexible substrate have a contact pad and one or more regions of the second flexible substrate have a contact pad, and at least one contact pad of the first flexible substrate is electrically connected to at least one contact pad of the second flexible substrate. In another aspect, the at least one contact pad of the first flexible substrate is in direct contact with the at least one contact pad of the second flexible substrate. In yet another aspect, the at least one contact pad of the first flexible substrate is connected to a conductive path that is connected to the at least one contact pad of the second flexible substrate. Preferably, the conductive path is a wire.

In one aspect, the conductive path is embedded in a connecting element. In another aspect, the conductive path is independent of any structural element.

In one aspect, one or more of the regions of the first device comprise a protective coating.

In one aspect, at least one flexible substrate is expanded and at least one flexible OLED is deposited on the expanded flexible substrate, such that the first device is expanded in at least one direction parallel to a plane of device based on local bending of the device.

In one aspect, the first device has a two dimensional shape. In another aspect, the first device has a three dimensional shape.

In one aspect, the first device is a lamp.

In one aspect, the flexible substrate comprises metal foil, plastic, fabric, glass, paper or combinations thereof. In another aspect, the first device has a bending length of about 1.0 cm to about 30.0 cm. In yet another aspect, the flexural rigidity is about $10^{-1}$ Nm to about $10^{-6}$ Nm.

In one aspect, the metal foil comprises an aluminum foil, stainless steel foil, copper foil or combinations thereof. In another aspect, the stainless steel foil has a thickness of about 20 microns to about 200 microns.

In one aspect, the plastic comprises polyethylene terephthalate, polyethylene naphthalate, or combinations thereof. In another aspect, the plastic has a thickness of about 40 microns to about 800 microns.

In one aspect, the metal foil comprises aluminum foil. In another aspect, the aluminum foil has a thickness of about 30 microns to about 500 microns.

In one aspect, the glass comprises a flexible glass. In another aspect, the flexible glass comprises a borosilicate glass and has a thickness of about 50 microns to about 800 microns.

In one aspect, the first device further comprises an insulating material deposited between the substrate of the first device and the OLED. In another aspect, the insulating material comprises a polyimide layer. Preferably, the polyimide layer has a thickness of about 2 microns to about 20 microns. In another aspect, the insulating material comprises an inorganic dielectric layer.

In one aspect, the OLED is covered with a thin film encapsulation layer. In another aspect, a hard coat layer is present on top of the thin film encapsulation layer. In yet another aspect, the at least one structurally weakened region is substantially free of a thin film encapsulation layer. Preferably, the thin film encapsulation layer has a thickness of less than 10 microns.

In one aspect, the OLED comprises a single pixel. In another aspect, the OLED comprises a plurality of pixels. In one aspect, the plurality of pixels are connected in series.

In another aspect, the plurality of pixels are connected in parallel.

In one aspect, the first device contains no transistors.

In another aspect the first OLED disposed on the first flexible substrate is electrically connected to the second OLED disposed on the second flexible substrate. In one aspect the first OLED and the second OLED are electrically connected in series. In one aspect the first OLED and the second OLED are electrically connected in parallel. In one aspect the electrical connection is through the interconnect.

BRIEF DESCRIPTION OF THE DRAWINGS

FIG. 7(d) shows multiple flexible OLEDs, each mounted to a rigid support and suspended by wires from the rigid support.

FIGS. 18(a) and (b) show the anode and the cathode layouts and contact pads. FIG. 18(c) shows the anode and cathode layouts and contact pads superimposed with additional markings for cuts that may be made in the first flexible substrate.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
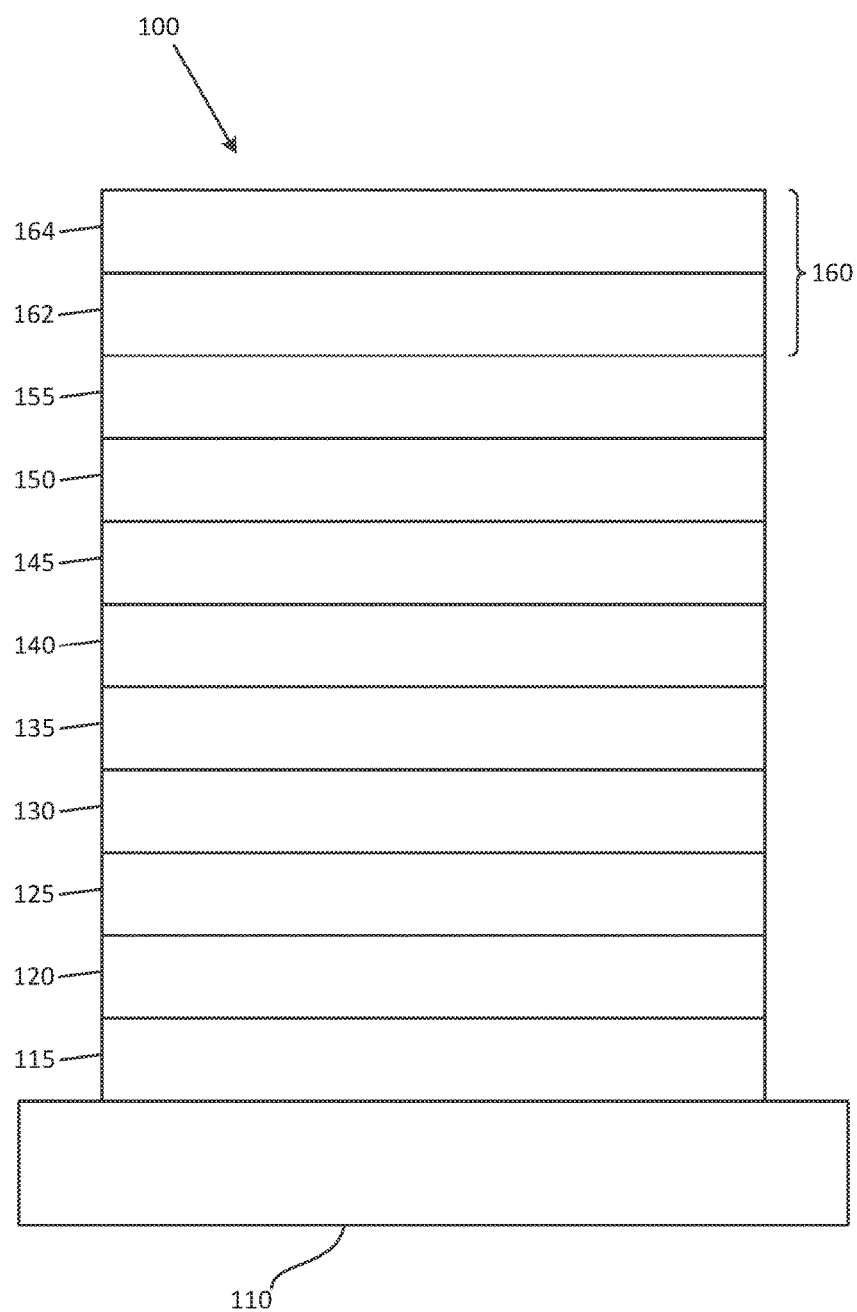
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F.sub.4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
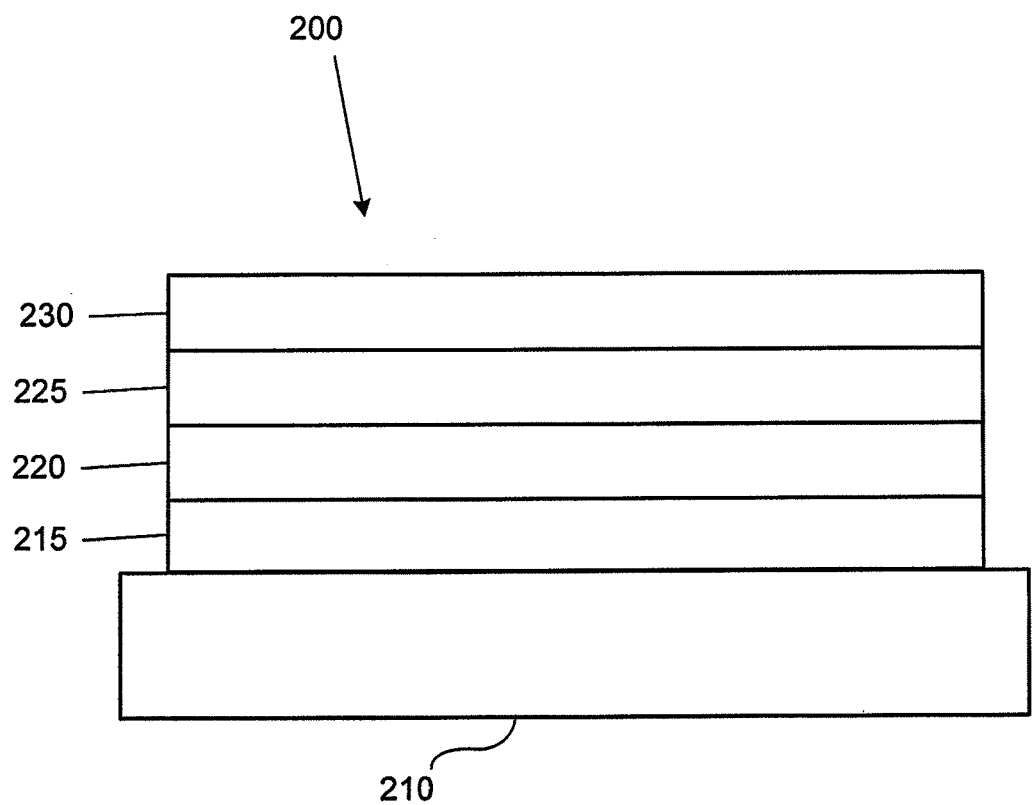
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

Figure 3:
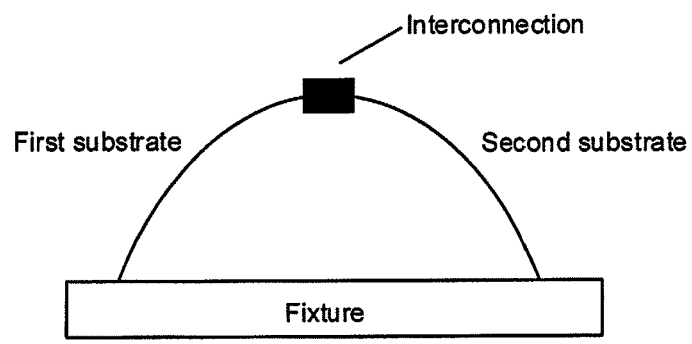
FIG. 3 shows exemplary devices comprising multiple flexible substrates, and each substrate may have an OLED deposited on it.
Figure 3:
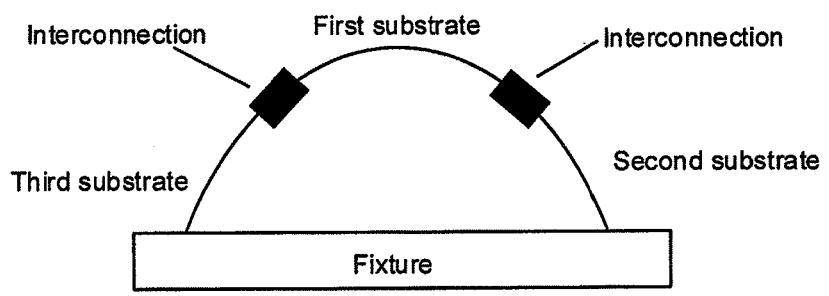
Figure 3:
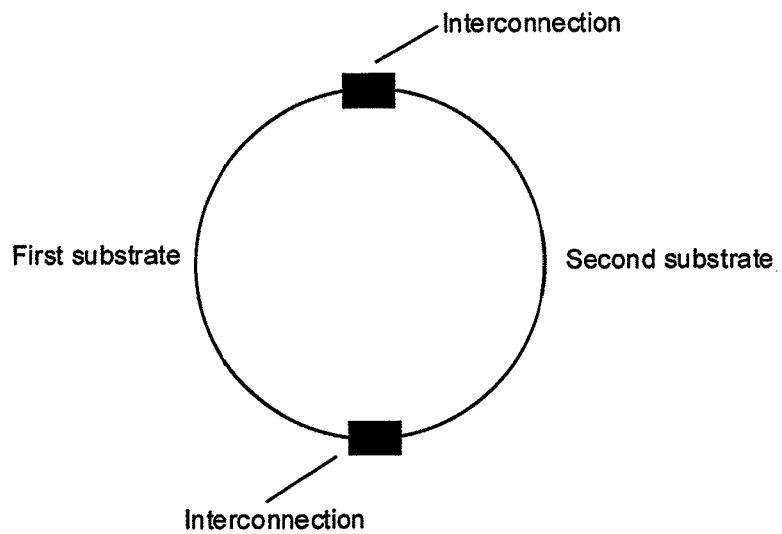

A device is provided, which comprises at least one flexible substrate with at least one flexible OLED deposited thereon, wherein the at least one flexible substrate is connected to at least another flexible substrate (illustrated in FIG. 3). The device may be a free-form lamp that comprises multiple flexible substrates having OLEDs deposited on them (illustrated in FIG. 26). The free-form shape of the lamp may be defined by the flexural rigidity of the flexible substrates and the connections between the flexible substrates. The free-form flexible OLED lamp may be used for decorative lighting.

Figure 6:
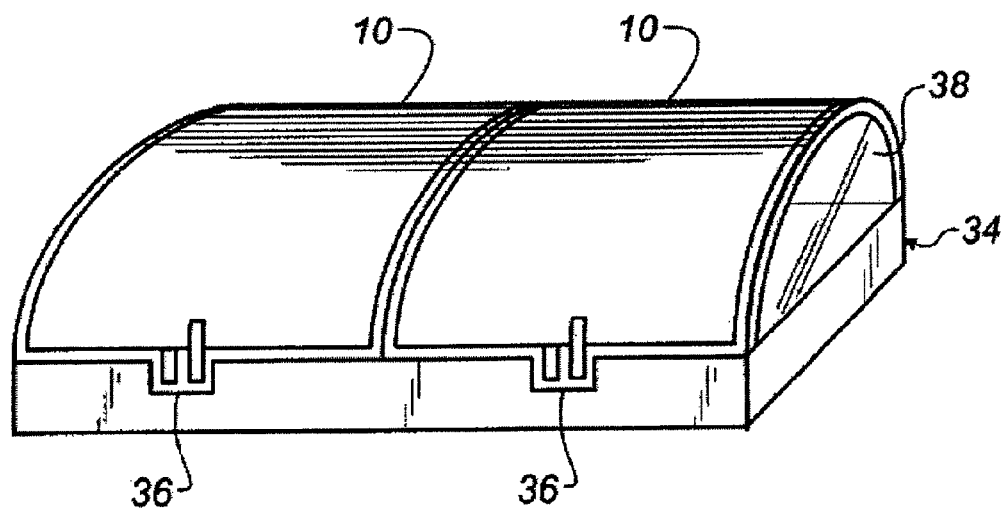
FIG. 6 shows exemplary flexible OLEDs held in a fixture.
Figure 7:
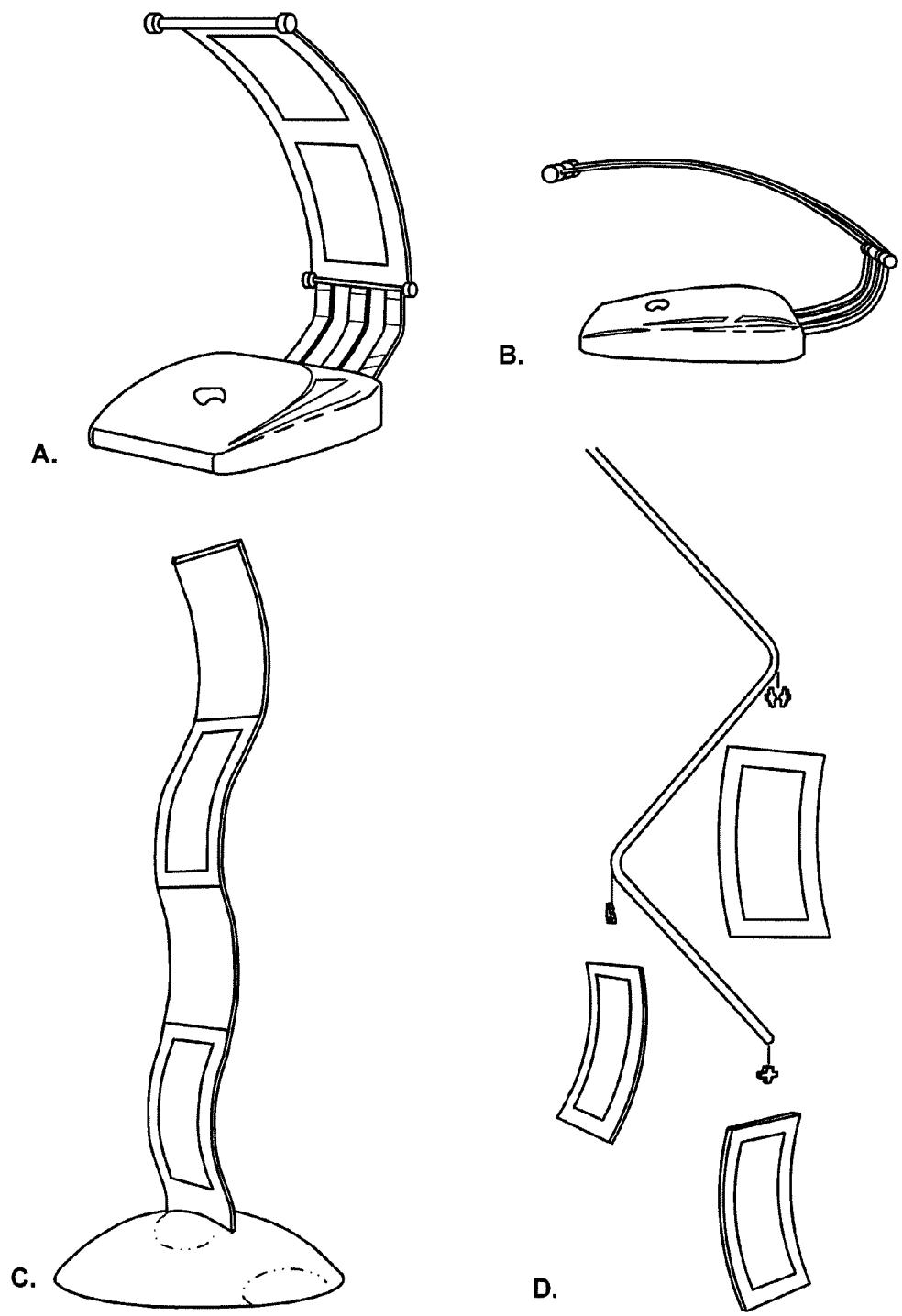
FIGS. 7(a-c) shows exemplary devices comprising flexible OLEDs held in place by a rigid support.
Figure 8:
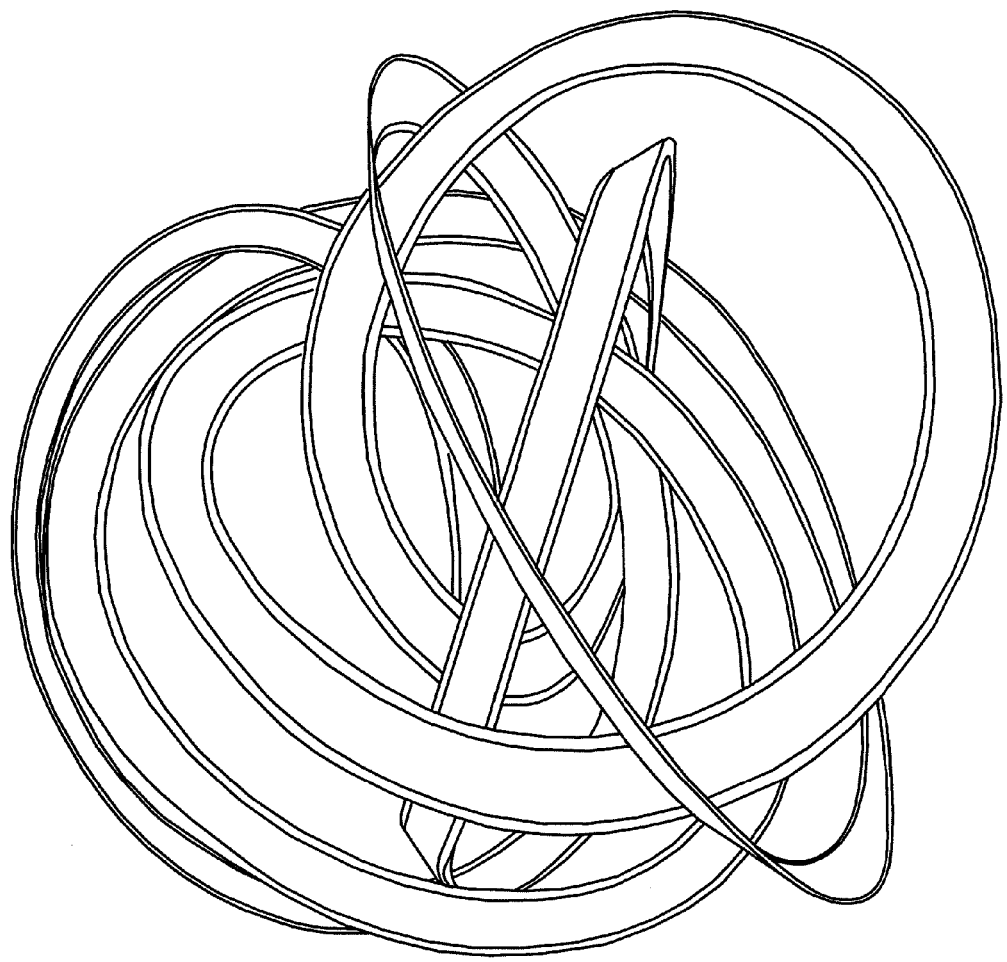
FIG. 8 shows an organic LED comprising a single substrate.

An organic LED lamp, which passes electrical current through phosphors, has been reported (FIG. 8). However, the organic LED lamp has several limitations, including very dim and inefficient light. Additionally, the organic LED lamp comprises only a single substrate, which may limit the three dimensional shape of the device. The devices provided herein may provide an improved light source in a variety of visually pleasing designs. Other OLED lighting sources have been reported in the prior art (illustrated in FIG. 6); however, these devices rely on a fixture to provide support for the flexible OLED substrates, which limits the free-form design options of the devices. For example, FIG. 6 describes OLED light sources on planar flexible substrates and a lighting fixture that removably receives and holds the OLED light sources. Two OLED light sources 10, which are shaped around a support 38, are inserted into apertures 36 in a common fixture 34, thereby curving the OLED light sources into three dimensional shapes. Additionally, FIG. 7(a-d) show flexible OLED lighting panels used in table lamps and a chandelier. In FIG. 7(a-c), the flexible OLEDs are held in position by a rigid support, which is intrusive to the design flow of the flexible panels. In FIG. 7(d), each of the flexible OLEDs are suspended separately by wires from the rigid support, and there is no continuity between flexible OLEDs. The devices provided herein eliminate the need for a rigid support or fixture to shape the OLED, which may improve the design characteristics of the device as well as lowering the cost of the device. The device provided herein also provides continuity between flexible OLEDs, which allows for numerous desirable free-form design possibilities.

A first device comprising a plurality of flexible substrates is provided. The plurality of flexible substrates includes at least a first flexible substrate and a second flexible substrate. The first flexible substrate has at least one flexible organic light emitting device (OLED) deposited thereon. There is at least one interconnection between the first flexible substrate and the second flexible substrate, and the interconnection is not directly attached to a fixture.

Figure 9:
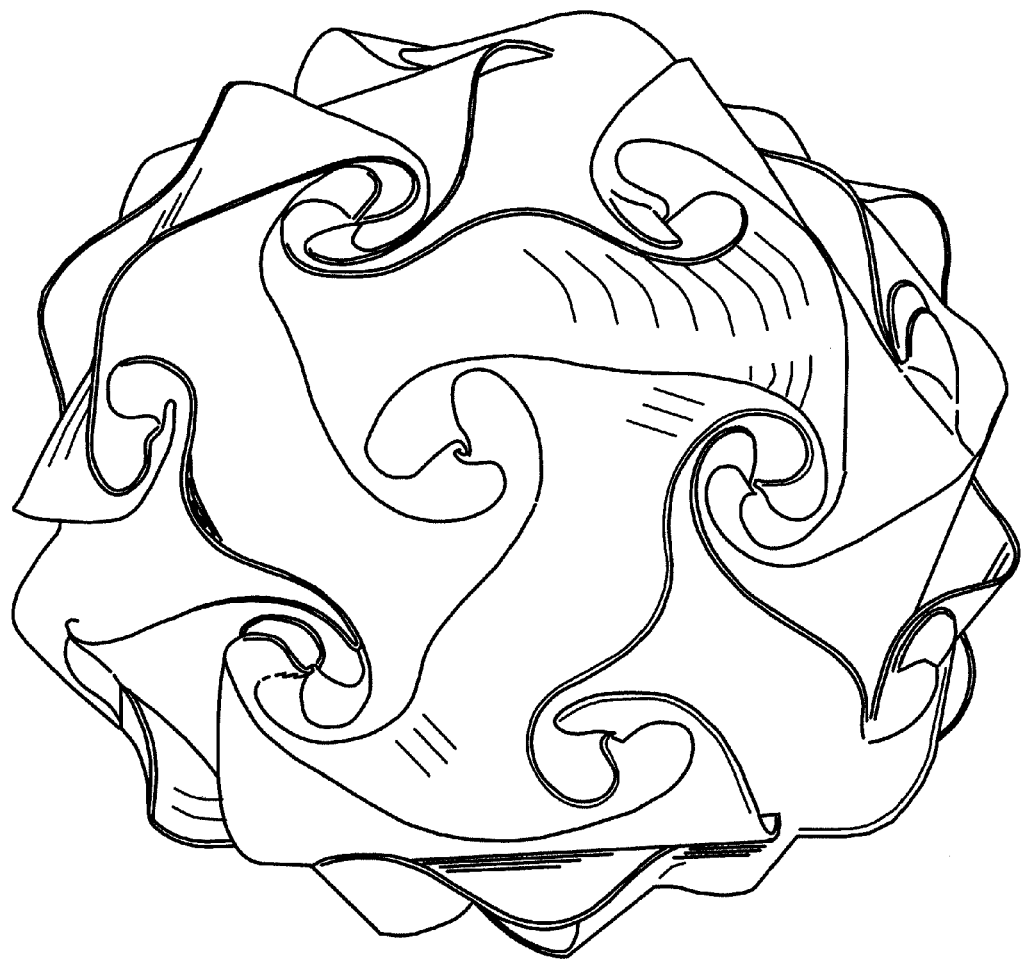
FIG. 9 shows a structure made of paper or foam that illustrates a device comprising multiple flexible OLEDs connected to form a ball-shaped light source.
Figure 26:
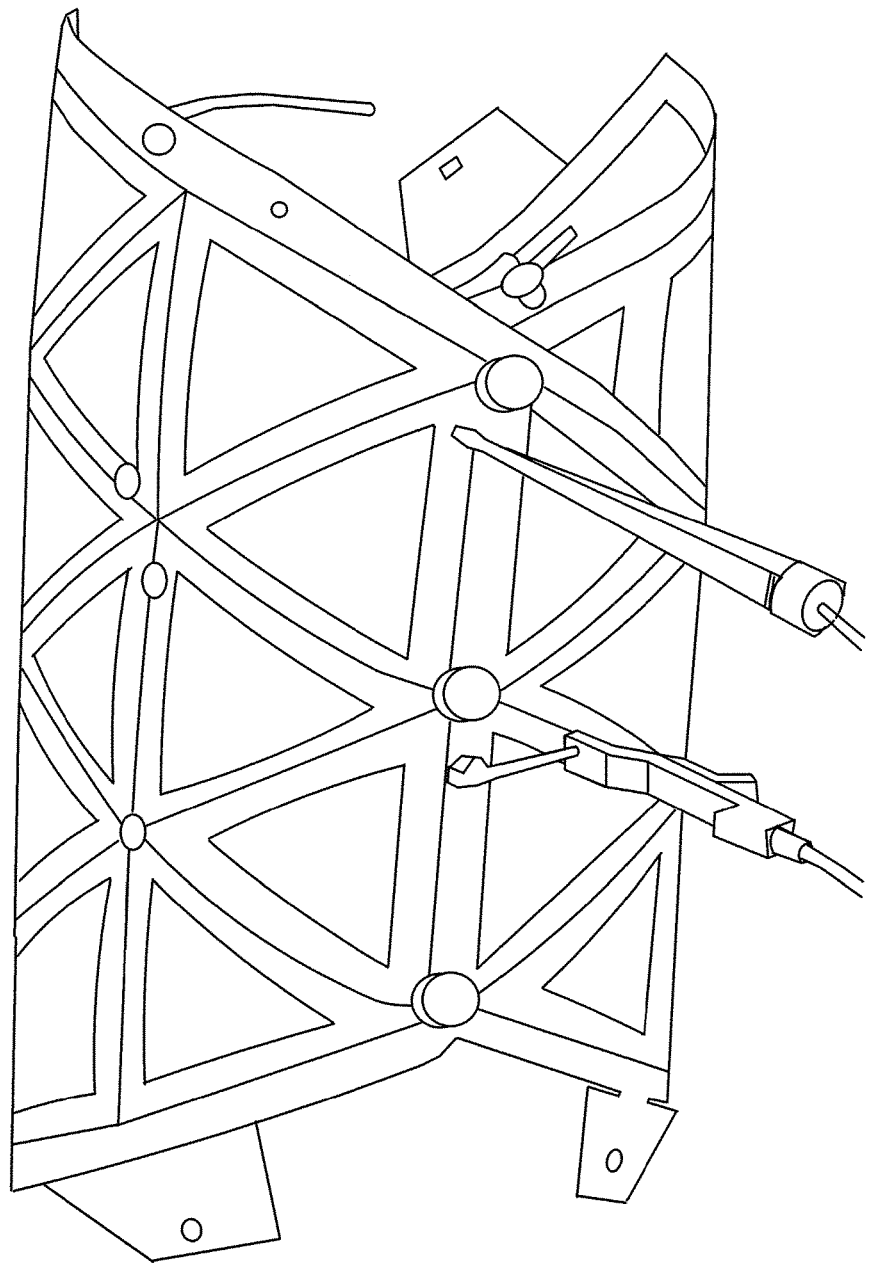
FIG. 26 shows a 3-dimensional OLED lamp comprising first and second flexible substrates that are connected using hook and eye interconnects with magnets as clamping elements and conductive adhesive interconnects.

The term 'fixture' as used herein refers to a rigid piece, if any, that is attached to the first device and attaches the first device to the outside world, i.e. something outside of the device. In general, the fixture may provide the electrical connection from the first device to a power source. Examples of a fixture include, but are not limited to, a base to set on a table, a bar to mount to the ceiling, a screw to which a string may be attached and then suspended from the ceiling, or a frame mounted on a wall. The device may optionally comprise a fixture. FIG. 9 and FIG. 26 illustrate examples of a first device that does not include a fixture.

The term 'not directly attached to' as used herein means that the at least one interconnection may be indirectly attached to the fixture via the flexible substrate, but not otherwise.

In one aspect, the second flexible substrate has at least one flexible organic light emitting device (OLED) deposited thereon.

In one aspect, the first flexible substrate is directly supported only by interconnections with other flexible substrates. However, other flexible substrates in the device may help support the interconnections. Therefore, the first substrate may be indirectly supported by other flexible substrates, which support the interconnections. In addition, a fixture may provide some definition to the shape of the device, but the fixture is remote from the first flexible substrate. This is illustrated in FIG. 3(b).

In one aspect, the shape of the first flexible substrate is defined by the mechanical properties of the plurality of flexible substrates and the interconnections between the plurality of flexible substrates. In another aspect, the shape of the first device is defined by the mechanical properties of the plurality of flexible substrates and the interconnections between the plurality of flexible substrates. In yet another aspect, the shape of the first device is not defined by any fixture (as illustrated in FIG. 3(c)).

In one aspect, the first flexible substrate is electrically connected to the second flexible substrate through the at least one interconnection.

Figure 16:
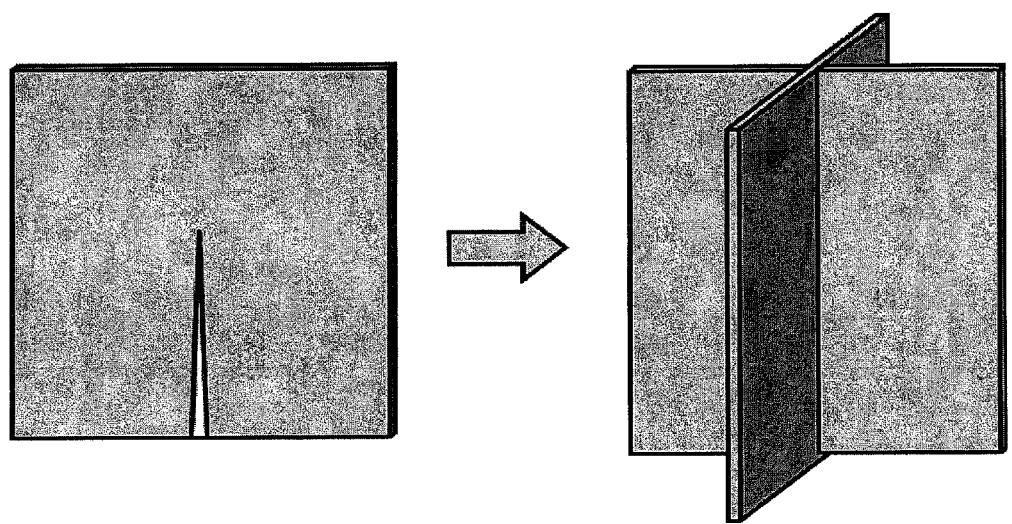
FIG. 16 shows an interlocked cuts interconnect.

In one aspect, the at least one interconnection between the first flexible substrate and the second flexible substrate is a direct connection, without a connecting element. Preferably, the at least one interconnection is one or more of a folded interconnect, an interlocked cut, a hook and eye system, an adhesive, a conductive adhesive, a soldered connection or a welded connection. FIG. 16 illustrates an interlocked cut interconnect between two flexible substrates. An interlocked cut may be particularly useful to form a temporary connection between flexible substrates. Additionally, a direct connection may include a gel or paste or the like that is deposited between the first and second flexible substrates, but no connecting element may be placed between the substrates. In this aspect, a direct connection includes, but it not limited to, adhesive, conductive adhesive, a soldered connection or a welded connection.

The term 'connecting element' as used herein refers to a separate solid piece, which is not a part of the flexible substrates, that is connected to the first and second flexible substrate. Non-limiting examples of a connecting element may include (i) a rod having grooves or adhesive to which the flexible substrates are attached, and (ii) tape having adhesive thereon. The connecting element can be rigid or flexible, so long as it is a separate piece. A rigid connecting element may help provide shape to the overall structure. Conversely, the overall shape of a device comprising a flexible connecting element may be predominantly determined by the mechanical properties of the flexible substrates. A layer of adhesive would not qualify as a connecting element, but tape having adhesive thereon would qualify. A connecting element excludes welded connections and soldered connections for the same reasons that just a layer of adhesive is excluded.

In one aspect, when the cut regions and the folded regions are used to form an interconnect between the first flexible substrate and the second flexible substrate, the cut regions and the folded regions are preferably located in the 10% of the area of a flexible substrate closest to an edge. The flexible substrates may have many different shapes, for example, a square, a circle, and a triangle. For example, the cut and folded regions are preferably in the 10% of the area of a square flexible substrate, a circular flexible substrate or a triangular flexible substrate, closest to an edge. By placing the cut regions and the folded regions near the edge of a flexible substrate, it is possible to minimize overlap and material usage. Preferably, the cut and folded regions are less than 2 cm from the edge of the flexible substrate. More preferably, the cut and folded regions are less than 1 cm from the edge of the flexible substrate. Most preferably, the cut and folded regions are less than 0.5 cm from the edge of the flexible substrate.

Figure 13:
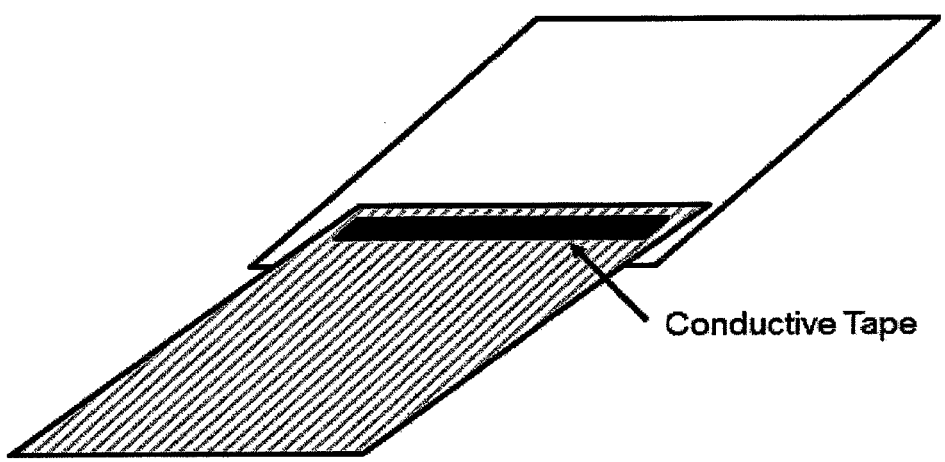
FIG. 13 shows a conductive tape interconnect.
Figure 14:
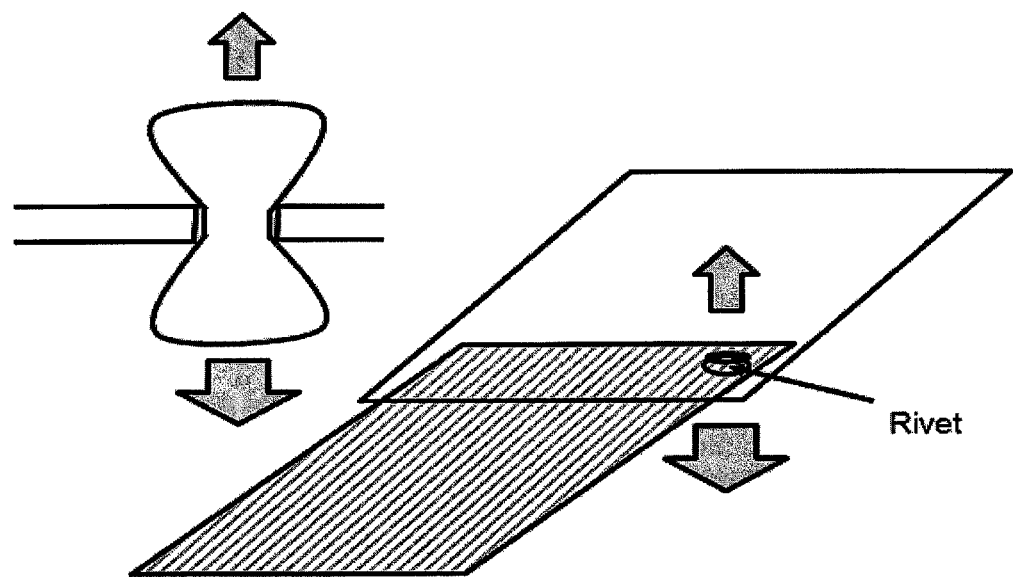
FIG. 14 shows a rivet interconnect.
Figure 15:
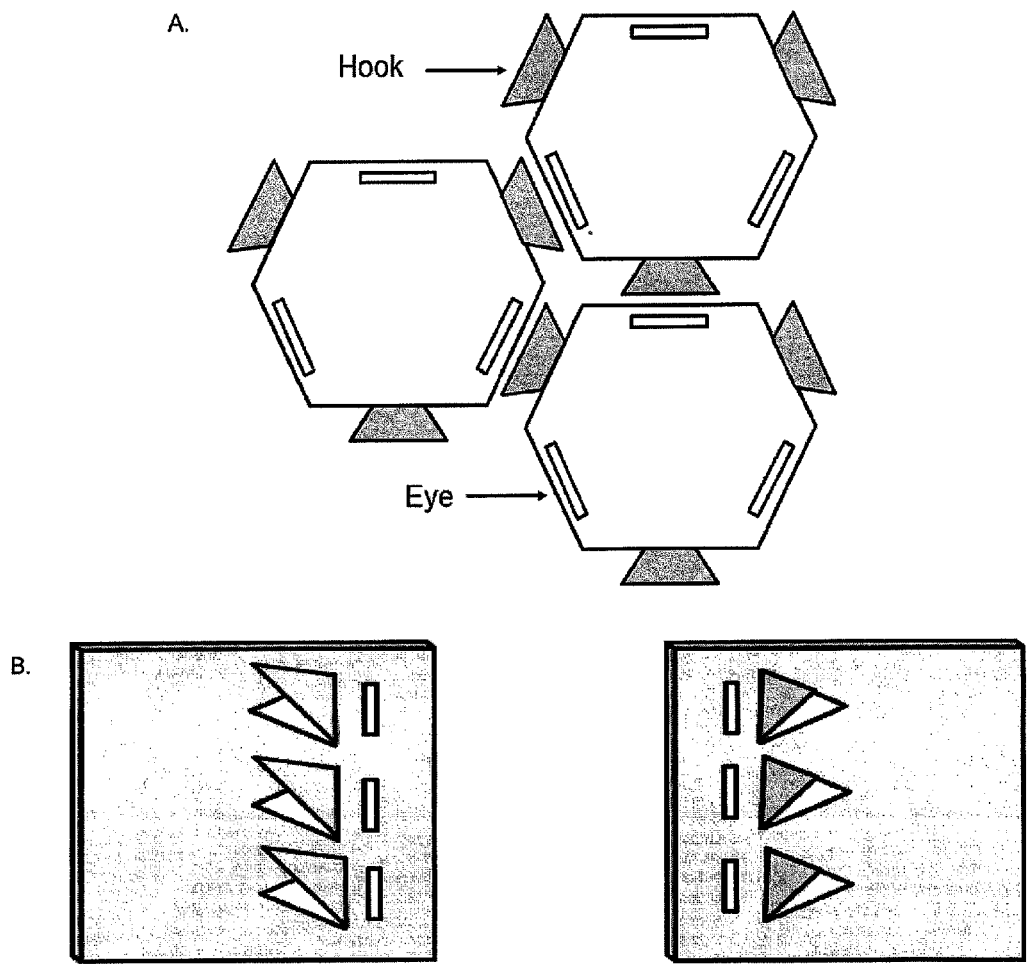
FIGS. 15(a) and (b) show hook and eye interconnects.
Figure 17:
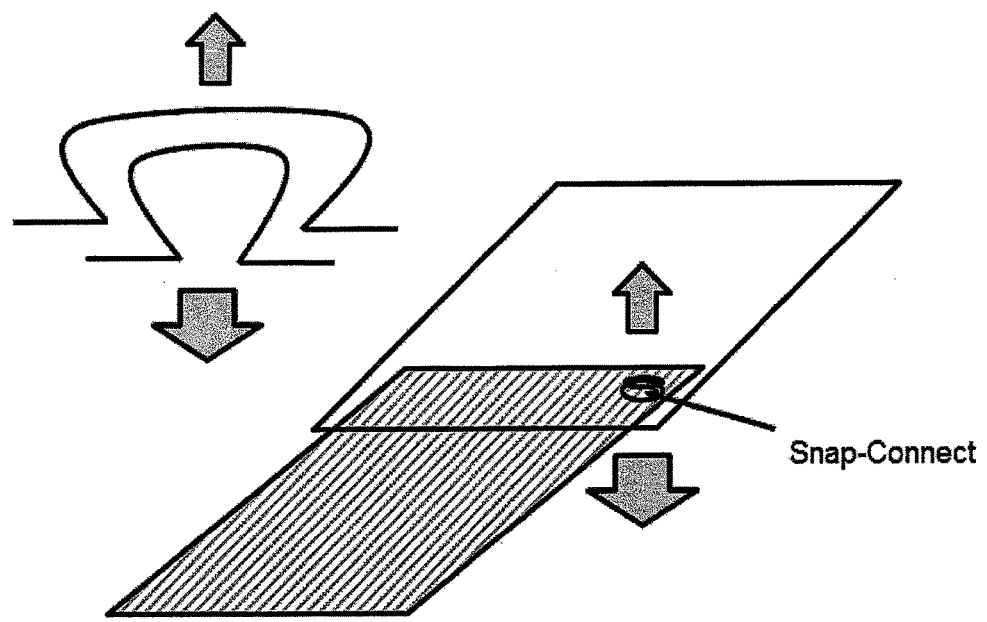
FIG. 17 shows a snap-connect interconnect.

In another aspect, the at least one interconnection between the first flexible substrate and the second flexible substrate is an indirect connection through a connecting element that is not the first flexible substrate or the second flexible substrate. Preferably, the interconnection is one or more of tape, conductive tape, a rivet, a hook and eye system, and a snap-connect. FIG. 13 illustrates a conductive tape interconnect between two flexible substrates. FIG. 14 illustrates a rivet interconnect between two flexible substrates. A rivet may be particularly useful to create a permanent interconnection between metal foil substrates. FIG. 15 illustrates hook and eye system interconnects between two flexible substrates. A hook and eye system may be particularly useful to create a temporary interconnect between flexible substrates. As discussed above, a 'connecting element' requires a separate solid piece. Therefore, a hook & eye system would be considered a connecting element if the hook is a separate piece that has been attached to the flexible substrate, e.g., glued on to the flexible substrate. If the hook was formed by cutting and folding the flexible substrate, then it would not be a connecting element. FIG. 17 illustrates a snap-connect interconnect between two flexible substrates. A snap-connect may be formed on a metal foil substrate using the substrate material. For other substrate materials, e.g., glass, a snap-connect may need to be fixed to the flexible substrate. Any or all of these interconnection types may be used with each other. In one aspect, the snap connect is formed on the flexible substrate. In another aspect, the snap connect is fixed to the flexible substrate.

Figure 12:
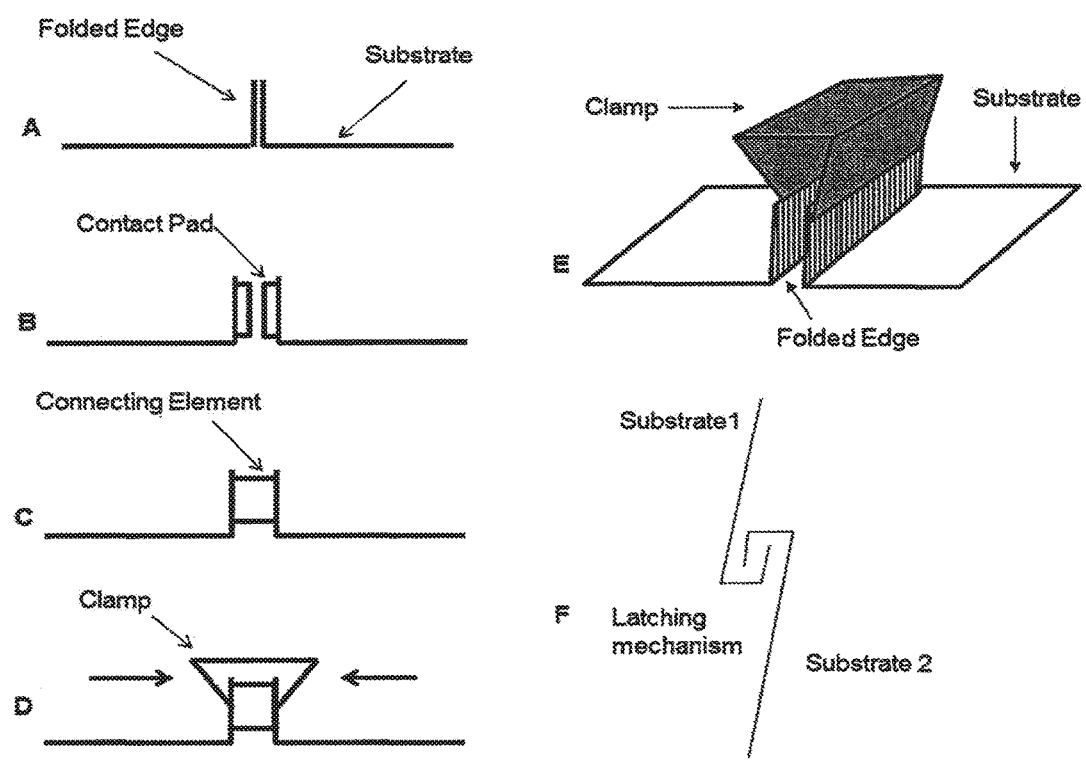
FIG. 12(a) shows a folded edge interconnect.
FIG. 12(b) shows a folded edge interconnect with contact pads.
FIG. 12(c) shows a folded edge interconnect with a connecting element.
FIG. 12(d) shows a folded edge interconnect with a connecting element and a clamp.
FIG. 12(e) shows a folded edge interconnect with a clamp.
FIG. 12(f) shows a latching mechanism.

The at least one interconnection between the first flexible substrate and the second flexible substrate may use a clamping element. In one aspect, the at least one interconnection between the first flexible substrate and the second flexible substrate an indirect connection and uses a clamping element that is not the first flexible substrate or the second flexible substrate. In another aspect, the at least one interconnection between the first flexible substrate and the second flexible substrate is an direct connection and uses a clamping element that is not the first flexible substrate or the second flexible substrate. As used herein, the term 'clamping element' refers to a separate piece, which is not part of the flexible substrates, located outside of the flexible substrates that holds the flexible substrates together. Non-limiting examples of a clamping element include a clip, a magnet, and clamp. A clamping element may consist of a single piece, as illustrated in FIG. 12. Alternatively, a clamping element may consist of two or more pieces, e.g., magnets. In one aspect, the at least one interconnection between the first flexible substrate and the second flexible substrate is a direct connection and uses a clamping element that is not the first flexible substrate or the second flexible substrate. For example, a clamping element may be used in combination with a folded interconnect.

Figure 11:
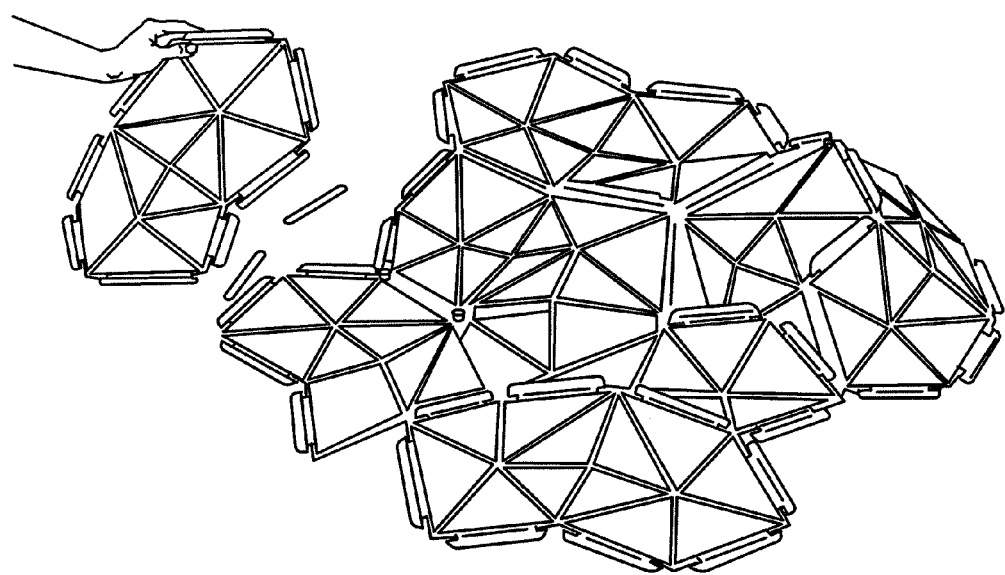
FIG. 11 shows a structure made of paper or foam that illustrates a device comprising multiple flexible OLEDs connected to form a light cloud.

FIG. 9 shows an example of a lamp comprising multiple flexible substrates that are connected together by cutting the substrates into the desired shapes and then interlocking the cuts together. This is a more complex example of the simplified interconnect shown in FIG. 16. FIG. 11 shows examples of lamps comprising multiple flexible substrates that are connected together by cutting the substrates into the desired shapes, and then folding the substrate edges. Folded edges on adjacent substrates are then clamped together to form a temporary connection (as shown in FIG. 12). It may be preferable to score the substrate prior to folding in order to reduce the stress on the rest of the substrate, in particular to reduce the stress in the substrate area where the OLED is deposited.

In one aspect, the at least one interconnection is temporary. In another aspect, the at least one interconnection is permanent.

Figure 4:
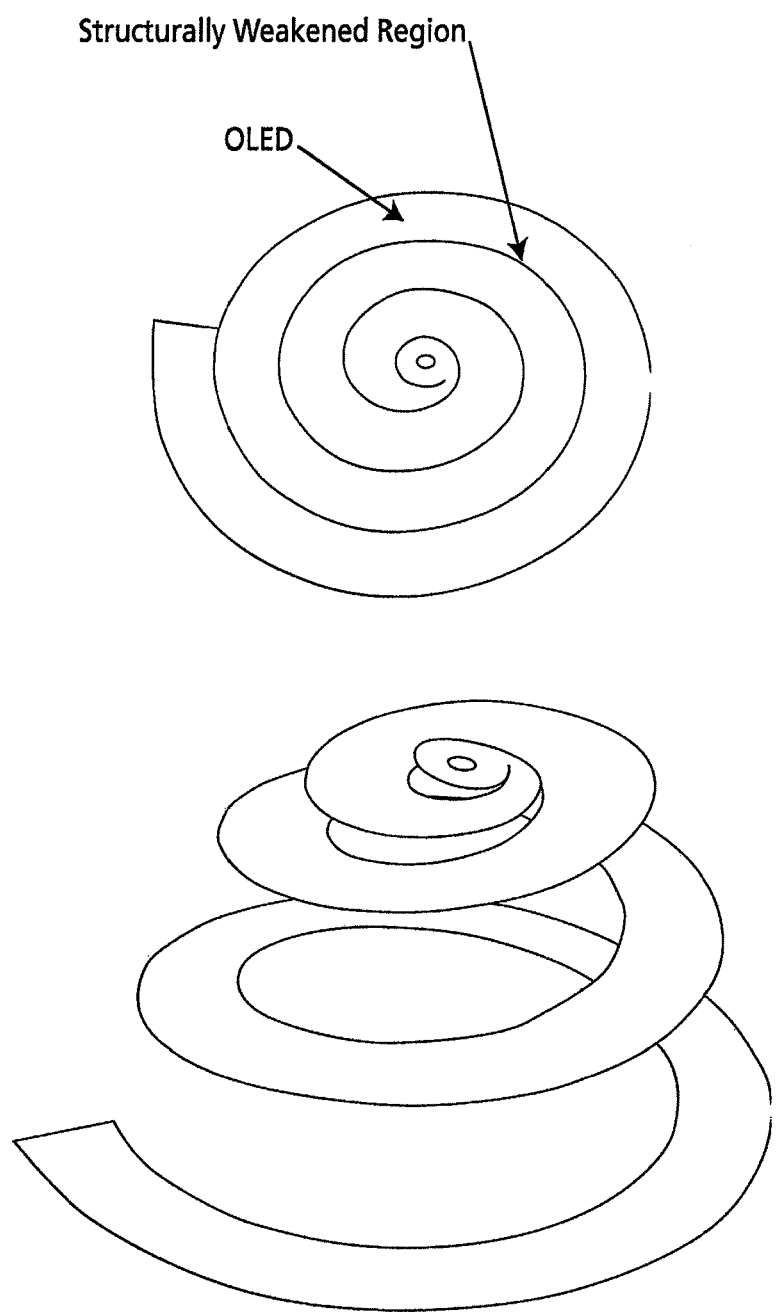
FIG. 4 shows a single flexible substrate with a particular flexural rigidity and structural weakened areas.

In another aspect, the first device comprises at least one structurally weakened region. For example, the first flexible substrate comprising an OLED may be cut such that it can form a three dimensional swirl (as illustrated in FIG. 4). In one aspect, the structurally weakened region comprises a cut region. In another aspect, the structurally weakened region comprises a scored region. In yet another aspect, the structurally weakened region comprises a perforated region. In a further aspect, the structurally weakened region comprises a folded region.

In one aspect, at least one structurally weakened region is formed prior to OLED deposition. In another aspect, the OLED is not deposited on the structurally weakened region.

In one aspect, the first flexible substrate is adjacent to the second flexible substrate. One or more regions of the first flexible substrate and one or more regions of the second flexible substrate may be folded, and the folded region of the first flexible substrate may be connected to the folded region of the second flexible substrate. "Folded" as used herein describes a shape that is not planar and has a corner.

In another aspect, a region of the first flexible substrate and a region of the second flexible substrate are scored prior to folding.

In yet another aspect, one or more regions of the first flexible substrate have a contact pad and one or more regions of the second flexible substrate have a contact pad, and at least one contact pad of the first flexible substrate is electrically connected to at least one contact pad of the second flexible substrate. FIG. 12(*b*) illustrates an electrical connection between flexible substrates using contact pads that are located on each folded edge and an electrical connect may run from the contact pads across the respective folds to the OLED.

In one aspect, the at least one contact pad of the first flexible substrate is in direct contact with the least one contact pad of the second flexible substrate. As used herein, the term "in direct contact with" allows a conductive gel or paste or the like to be deposited between the contact pad of the first flexible substrate and the contact pad of the second flexible substrate, but no intervening solid part may be placed between the contact pads.

In another aspect, the at least one contact pad of the first flexible substrate is connected to a conductive path that is connected to the at least one contact pad of the second flexible substrate. As used herein, a "conductive path" does not provide structure and it does not hold any part of the device in place. In one aspect, the conductive path is embedded in a connecting element. In another aspect, the conductive path is independent of any connecting element. Preferably, the conductive path is a wire.

In a further aspect, one or more of the regions of the first device comprise a protective coating.

In one aspect, at least one flexible substrate is expanded and at least one flexible OLED is deposited on the expanded flexible substrate, such that the first device is expanded in at least one direction parallel to a plane of device based on local bending of the device. The first flexible substrate may contain cuts (illustrated in FIG. 5(a)), allowing it to be expandable. The expanded substrate (illustrated in FIG. 5(b)) may be used in the device. The device may comprise multiple flexible substrates that are expanded.

Figure 10:
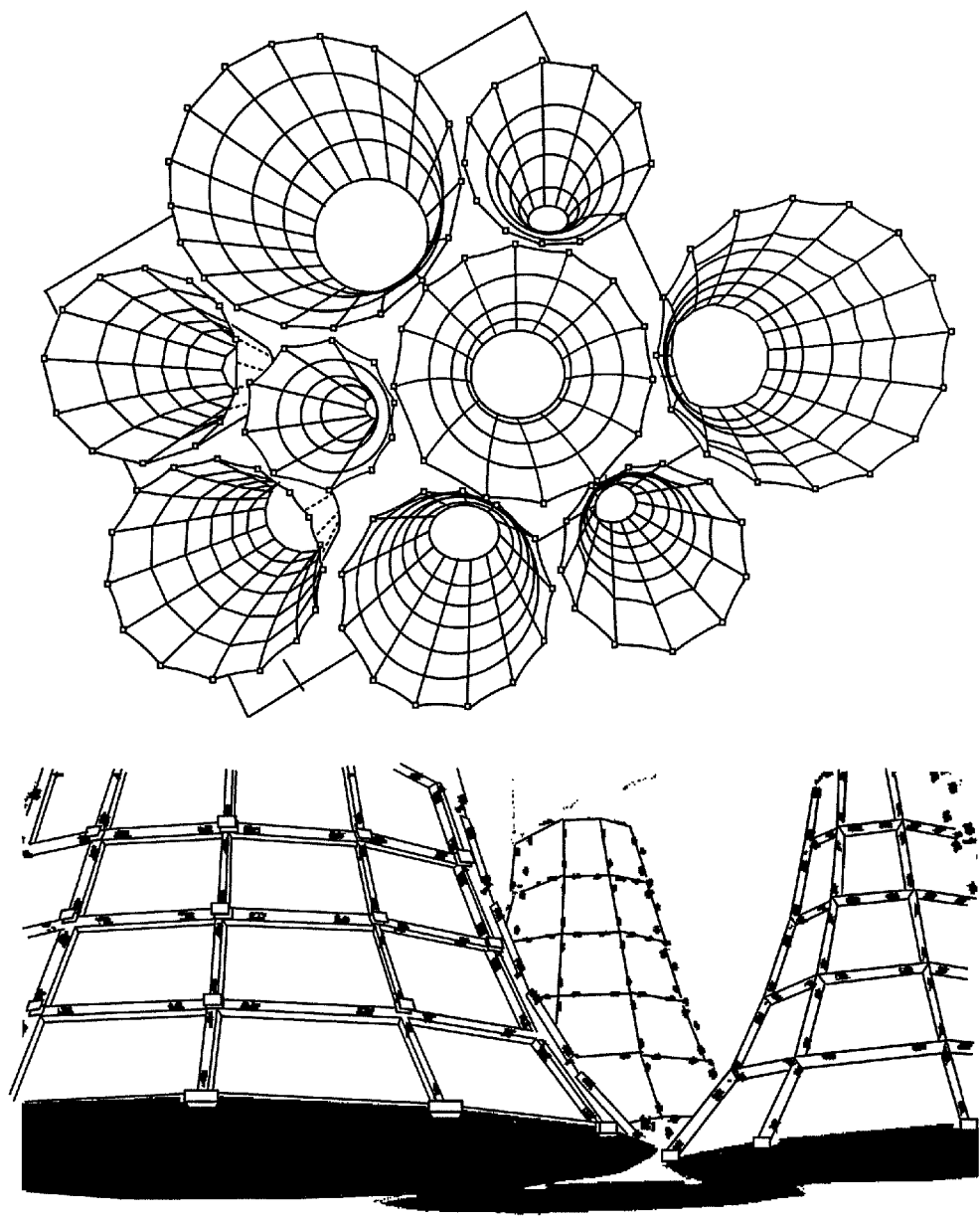
FIG. 10 shows a structure made of paper or foam that illustrates a device comprising multiple flexible OLEDs connected to form a lamp shade-shaped light source.

In one aspect, the first device has a two dimensional shape. In another aspect, the first device has a three dimensional shape. FIGS. 9-11 illustrate examples of devices comprising a three dimensional shape. FIG. 9 shows an exemplary device that may comprise multiple flexible substrates, having at least one flexible OLED attached, that are connected to form a ball of light. The device may comprise multiple flexible substrates that are connected together by cutting multiple flexible substrates into the desired shapes and then interlocking the cuts together. This is a more complex example of the simplified interconnect shown in FIG. 16. FIG. 10 shows a device that may comprise multiple flexible substrates, having at least one flexible OLED attached, that are connected to form a light shade shaped light source. In this example, interconnects are formed by cutting the flexible substrates into the desired shapes and/or folding the edges of the flexible substrates, and the folded edges are then clipped together. This is a more complex example of the simplified interconnect in FIG. 12. FIG. 11 shows an example of how multiple flexible substrates, having at least one OLED attached, may be connected to form a light cloud. In this example, interconnects are formed by cutting the flexible substrates into the desired shapes and/or folding the edges of the flexible panels, and the folded edges are then clipped together. This is a more complex example of the simplified interconnect in FIG. 12.

In one aspect, the first device is a lamp.

In one aspect, the flexible substrate comprises metal foil, plastic, fabric, glass, paper or combinations thereof. In another aspect, the first device has a bending length of about 1.0 cm to about 30.0 cm. In yet another aspect, the flexural rigidity is about $10^{-1}$ Nm to about $10^{-6}$ Nm.

In one aspect, the metal foil comprises an aluminum foil, stainless steel foil, copper foil or combinations thereof. In another aspect, the stainless steel foil has a thickness of about 20 microns to about 200 microns.

In one aspect, the plastic comprises polyethylene terephthalate, polyethylene naphthalate, or combinations thereof. In another aspect, the plastic has a thickness of about 40 microns to about 800 microns.

In one aspect, the metal foil comprises aluminum foil. In another aspect, the aluminum foil has a thickness of about 30 microns to about 500 microns.

In one aspect, the glass comprises a flexible glass. In another aspect, the flexible glass comprises a borosilicate glass and has a thickness of about 50 microns to about 800 microns.

In one aspect, the first device further comprises an insulating material deposited between the substrate of the first device and the OLED. In another aspect, the insulating material comprises a polyimide layer. Preferably, the polyimide layer has a thickness of about 2 microns to about 20 microns. In another aspect, the insulating material comprises an inorganic dielectric layer.

In one aspect, the OLED is covered with a thin film encapsulation layer. In another aspect, a hard coat layer is present on top of the thin film encapsulation layer. In yet another aspect, the at least one structurally weakened region is substantially free of a thin film encapsulation layer. Preferably, the thin film encapsulation layer has a thickness of less than 10 microns.

In one aspect, the OLED comprises a single pixel. In another aspect, the OLED comprises a plurality of pixels. In one aspect, the plurality of pixels are connected in series. In another aspect, the plurality of pixels are connected in parallel.

In another aspect the first OLED disposed on the first flexible substrate is electrically connected to the second OLED disposed on the second flexible substrate. In one aspect the first OLED and the second OLED are electrically connected in series. In one aspect the first OLED and the second OLED are electrically connected in parallel. In one aspect the electrical connection is through the interconnect. Connecting OLEDs on one flexible substrate in series with OLEDs on an adjacent flexible substrate may be preferred in terms of design simplicity of interconnections and anode and cathode contacts. However, in some circumstances it may be preferred to reduce overall device voltage by connecting OLEDs on one flexible substrate in parallel with OLEDs on an adjacent flexible substrate.

In one aspect, the first device contains no transistors.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. These other materials are disclosed in U.S. Patent Publication No. 2010/0295032 and 2011/0057559, the disclosures of which are herein expressly incorporated by reference in their entirety.

Experimental

Figure 5:
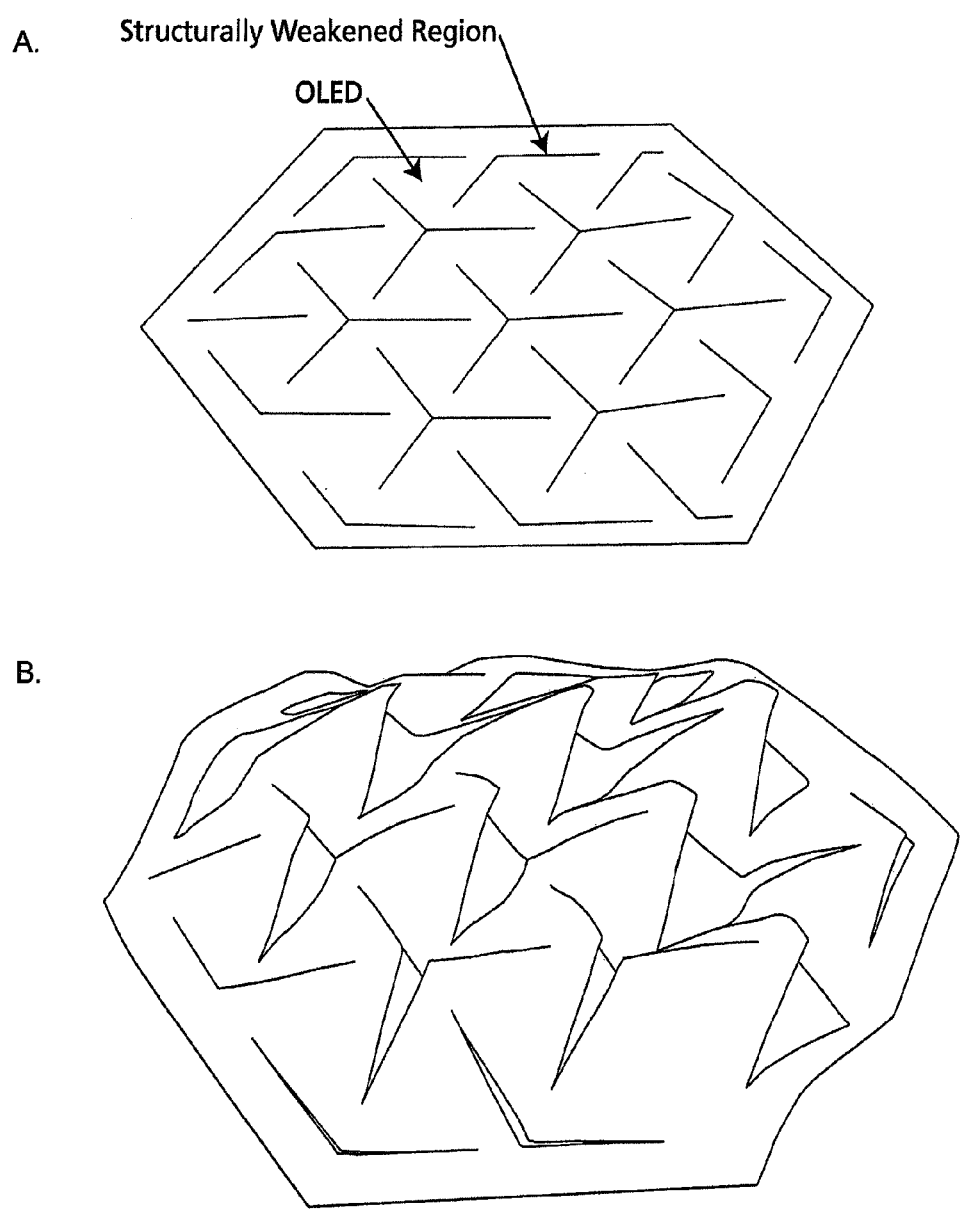
FIG. 5 shows a single flexible substrate having an OLED deposited on it, and the substrate is cut so it can be expanded.
Figure 18:
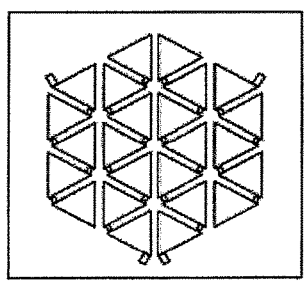
FIGS. 18(a-c) show an OLED pixel layout on the first flexible substrate.
Figure 18:
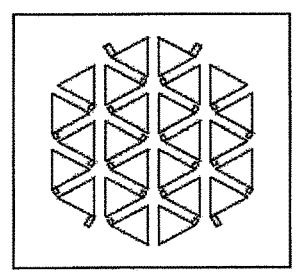
Figure 18:
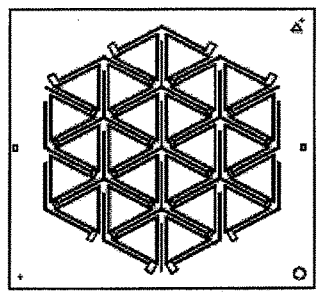
Figure 19:
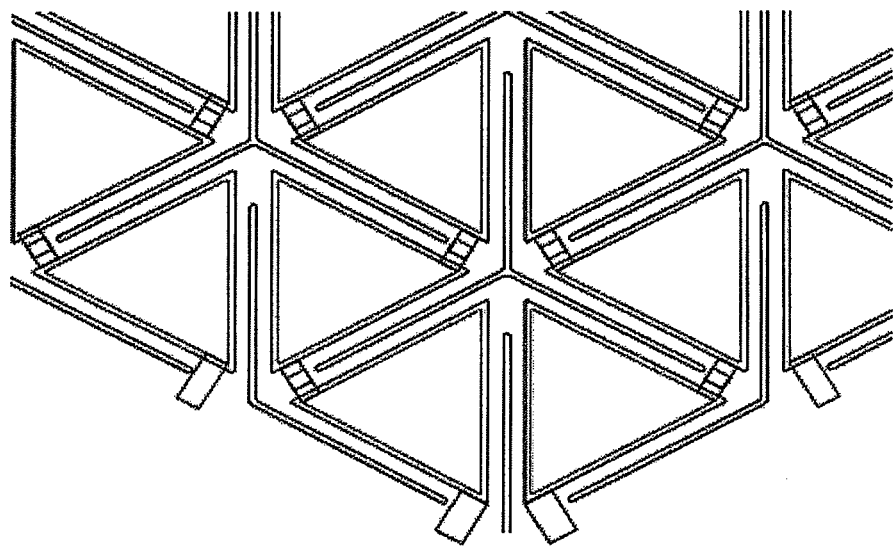
FIG. 19 shows an enlargement of the OLED pixel layout on a first substrate, as shown in FIGS. 18(a-c).

In one embodiment, the first flexible substrate is as shown in FIGS. 5 A-B and the OLED pixel layout on the first flexible substrate is as shown in FIG. 18(a)-(c) and in FIG. 19. In one embodiment, the first flexible substrate is a sheet of 60 micron thickness stainless steel foil. In this embodiment, the first device comprises 24 triangular OLED pixels separated by structurally weakened cut regions in a hexagonal pattern. The OLED pixels are connected in four series strings, where two of the series strings consist of five OLED pixels, and two of the series strings consist of seven OLED pixels. Within the series strings, the cathode from the first pixel contacts the anode of the second pixel and so on.

In FIG. 18(a) and FIG. 18(b) anode and cathode contact pads can be seen. These are the small square pads that extend beyond the hexagon pattern. Contact pads may be deposited in the same process and/or using the same materials as the anode and cathode layers. Contact pads may be used to make electrical contact to the OLED devices. Contact pads may also be used to make electrical and/or mechanical contact between the first flexible substrate and the second flexible substrate, although a contact pad is not considered a connecting element. In one embodiment, a contact pad on the first flexible substrate is in direct contact with a contact pad on the second flexible substrate. In another embodiment, the direct contact comprises one or more of a folded interconnect or an interlocked cut. In yet another embodiment, a contact pad on the first flexible substrate touches a contact pad on the second substrate. Alternatively, a contact pad on the first substrate is connected to a contact pad on the second substrate through one or more of an adhesive, a conductive adhesive, a soldered layer or welded layer. In another embodiment, a contact pad on the first flexible substrate is connected to a contact pad on the second flexible substrate through a solid connecting element, which may be disposed between the two substrates. In yet another embodiment, the connecting element may include a wire, a snap-connect, a rivet, tape, conductive tape or a hook and eye system.

Figure 20:
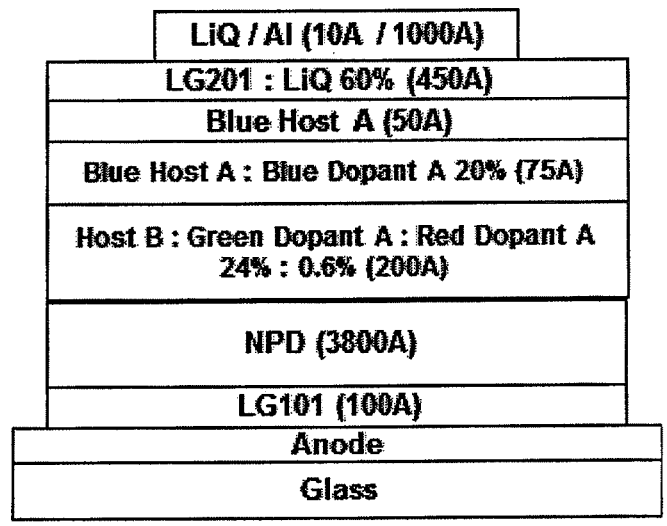
FIG. 20 shows an organic light emitting device stack.

The anode may comprise 3000 Å Al deposited by vacuum thermal evaporation (VTE) through a shadow mask onto a polyimide planarization layer, which is itself disposed on a 60 micron thickness stainless steel foil substrate. In one embodiment, the anode layer is reflective, giving rise to a top-emitting OLED. In one embodiment, the organic layers are disposed onto the substrate by vacuum thermal evaporation through a shadow mask. In one embodiment, the OLED stack comprises 100 Å LG101 as a hole injection layer (HIL) (supplied by LG Chemicals of Korea), 3800 Å NPD as a hole transport layer (HTL), a 200 Å thickness first emissive layer (EML1), a 75 Å thickness second emissive layer (EML2), a 50 Å thickness blocking layer (BL), a 450 Å thickness electron transport layer (ETL) of LG201 (supplied by LG Chemicals of Korea) doped with 65% lithium quinolate (Liq), and a 10 Å thickness layer of Liq as an electron injection layer (EIL). In one embodiment, the cathode layer is deposited onto the organic layers through a shadow mask using VTE. In one embodiment, a semi-transparent compound cathode of 120 Å thickness Mg:Ag (10% Ag) can be deposited through the shadow mask design shown in FIG. 18(b). A schematic of the OLED device stack is shown in FIG. 20. Typical materials are shown below:

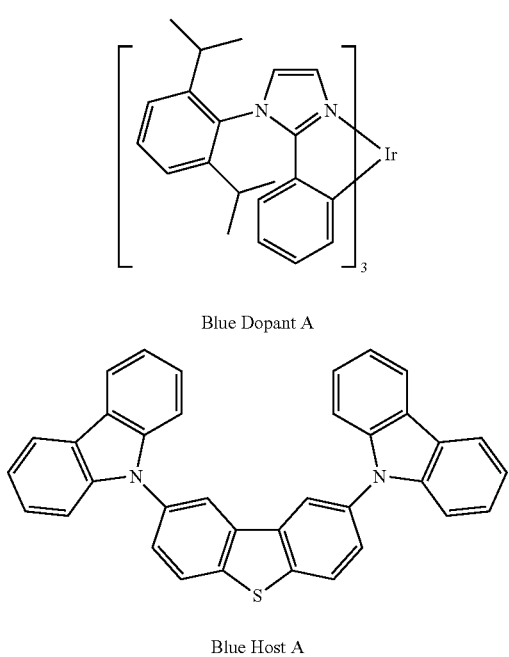

Blue Dopant A

Blue Host A

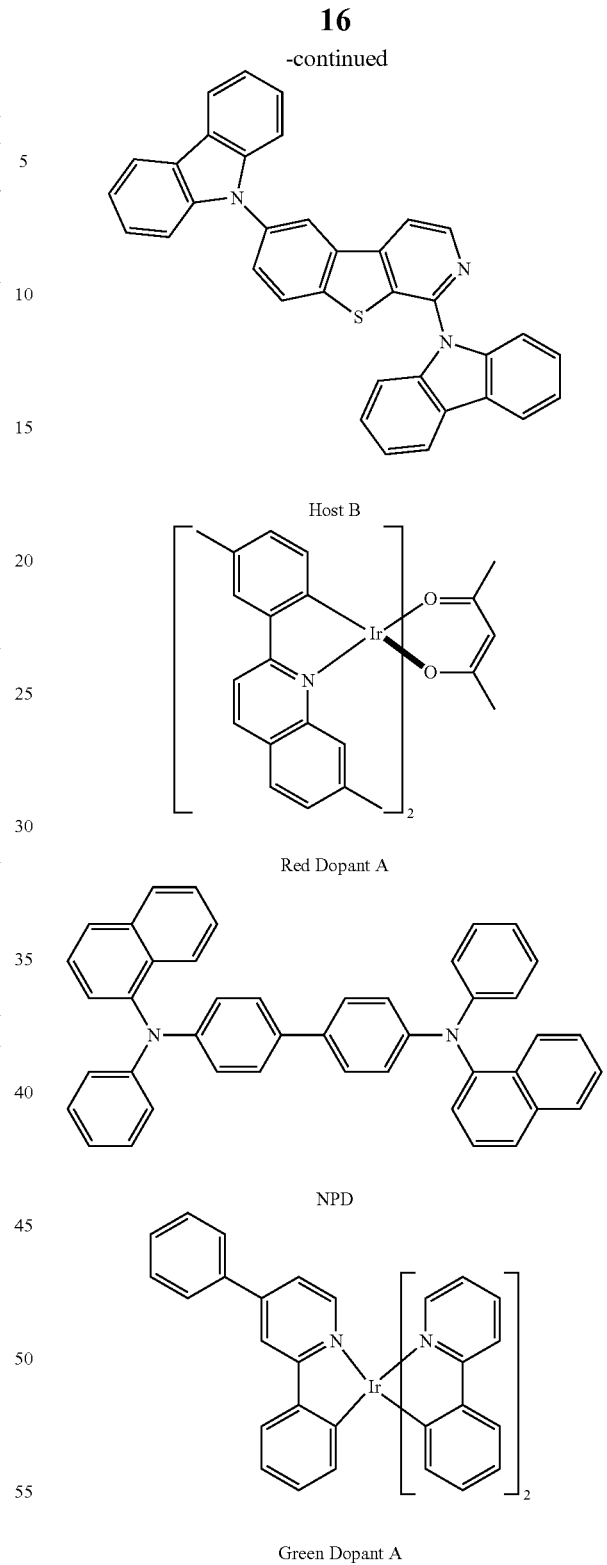

Host B

Red Dopant A

NPD

Green Dopant A

As shown in FIG. 18(c), all anode and cathode areas should be contained within areas between structurally weakened regions. It is preferred that the organic materials of the organic stack are also contained within areas between structurally weakened regions. Each complete OLED pixel is then contained in an area between structurally weakened regions.

FIG. 19 shows an enlargement of FIG. 18(c). The smaller triangles are the cathode areas, the larger triangles are the anode areas. FIG. 19 also shows the cut marks between OLED pixels. In a preferred embodiment, the cut lines have rounded ends, to minimize the risk of tearing the substrate upon formation of the three dimensional configuration. Additionally, it is also preferable that the rounded edges comprise circular holes in the substrate at each end of the cut.

In one embodiment, the OLED is covered with a thin film encapsulation (TFE) layer. The thin film encapsulation layer may completely cover the OLED. In one embodiment, one or more contact pads between adjacent devices, where the anode of one pixel contacts the cathode of an adjacent pixel, are uncovered by the thin film encapsulation layer. When one or more contact pads remain exposed, it is possible make electrical contact at these one or more contact pads to select a sub-set of the pixels to illuminate. Only the pixels between the two points where electrical contact is made will illuminate. In another embodiment, one or more contact pads between adjacent devices are reinforced with a conductive material to ensure reliable electrical contact and provide mechanical stability. This may be especially desirable where the bridge remains exposed, and where a thin and semi-transparent cathode material is used. In yet another embodiment, one or more exposed contact pads on a first flexible substrate are connected to one or more exposed contact pads on a second flexible substrate.

It is common to use thin film encapsulation layers that are a combination of organic and inorganic materials. The inorganic materials provide an effective barrier against the permeation of moisture and oxygen, while the organic materials provide mechanical flexibility and help to distribute any faults in the inorganic layers, which increase the diffusion path length through the barrier.

In another embodiment, a hard coat layer is present on top of the thin film encapsulation layer. The hard coat layer can provide additional protection to the thin film encapsulation layer and the OLED and/or include scattering layers which improve color uniformity and light extraction. Exemplary materials for the hard coat layer include, but are not limited to, polyimide, polyurethane, and polyacrylate. In one embodiment, the thin film encapsulation layer has a thickness of less than 10 microns. In another embodiment, the at least one structurally weakened region is substantially free of the thin film encapsulation layer. By "substantially free of the thin film encapsulation layer" it is meant that the footprint of the thin film encapsulation layer does not extend past the structurally weakened regions within the limits of precision of the thin film deposition technique, for example, PECVD. This may be especially beneficial when the structurally weakened region is formed after deposition of the thin film encapsulation layer.

In one embodiment, one or more of the edges of the first device comprise a protective coating. The protective coating may smooth the edge of the device if this is required for a particular application. In another embodiment, the protective coating can comprise metal foil, plastic, fabric, flexible glass, paper or combinations thereof. The protective coating should generally closely match the mechanical characteristics of the flexible substrate. In one embodiment, the protective coating is a hard coat layer comprising polyimide, polyurethane or polyacrylate. In yet another embodiment, the protective coating may be used to make electrical contact to the device.

Figure 21:
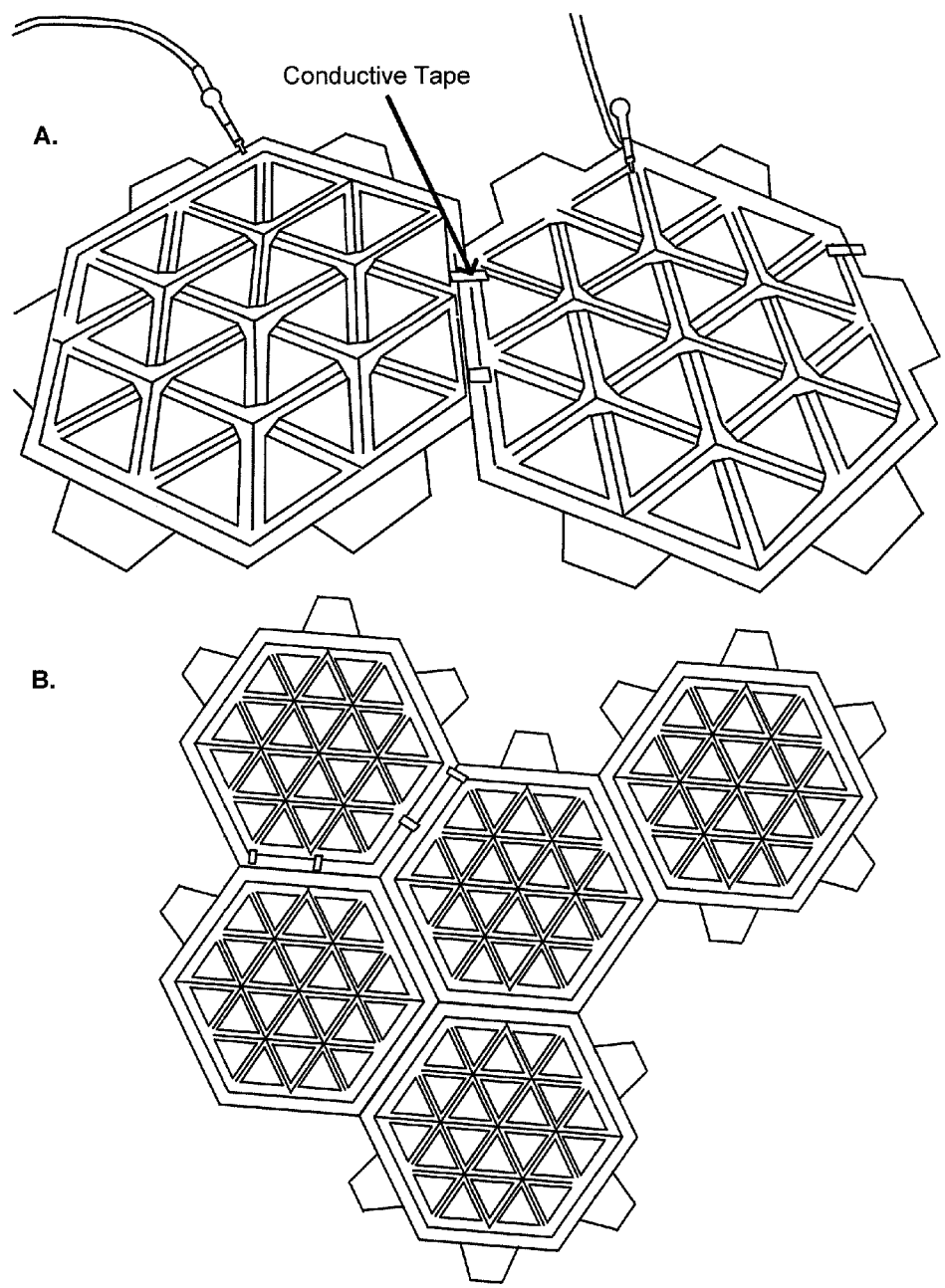
FIGS. 21(a) and (b) show flexible substrates connected to one another.

In a first embodiment one or more flexible substrates as shown in FIG. 5, may be connected as shown in FIG. 21. FIG. 21(a) shows a first flexible substrate connected to a second flexible substrate. FIG. 21(b) shows multiple flexible substrates connected in a hexagonal array.

Figure 22:
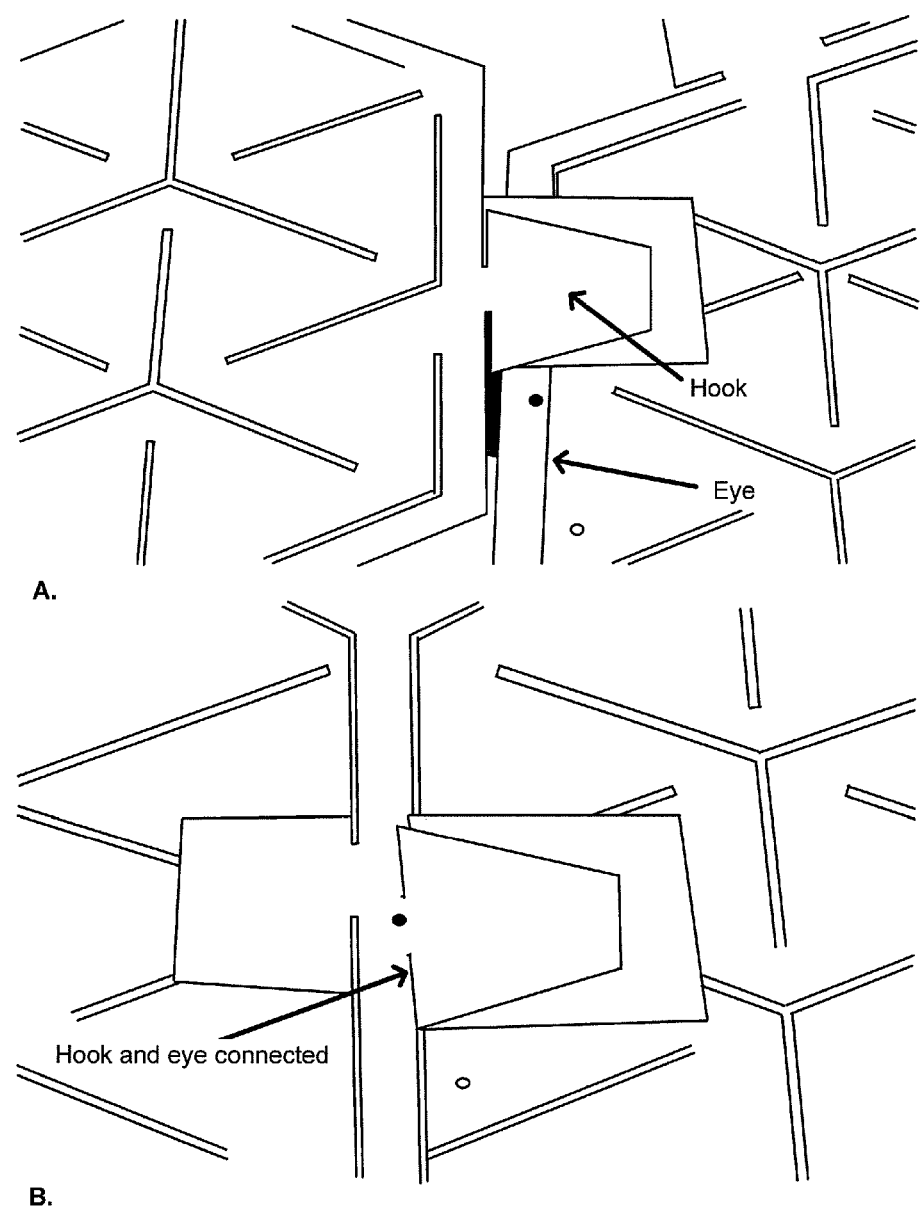
FIGS. 22(a) and (b) show a first and second flexible substrate connected using a hook and eye interconnect.

In this first embodiment, first and second flexible substrates are mechanically connected using a hook and eye system interconnect which is shown in detail in FIG. 22. FIG. 22(a) shows a hook structure, which has been defined by cutting the edge of the first flexible substrate, and an eye structure, which has been defined by cutting the edge of the second flexible substrate. FIG. 22(b) shows first and second flexible substrates connected using a hook and eye interconnect. The piece of paper shown beneath the hook in FIG. 22 is there to provide contrast in the image, and is for illustration purposes only.

In this first embodiment, first and second flexible substrates are electrically connected using a connecting element that is a conductive tape interconnect. As illustrated in FIG. 21(a), the conductive tape allows electrical current to pass between the first and second flexible substrates. An anode pad on the first flexible substrate (on the left) is connected by a clip to an external power source. A cathode pad on the second flexible substrate (on the right) is connected by a clip to an external power source. Current flows between the anode pad on the first flexible substrate and the cathode pad on the second flexible substrate through the conductive tape interconnect, illuminating OLEDs on both first and second flexible substrates. In this first embodiment, a hook and eye interconnect provides robust mechanical connection, while a conductive tape interconnect provides robust electrical connection. In this first embodiment, OLEDs disposed on the first flexible substrate are connected in series with OLEDs disposed on the second flexible substrate.

Figure 23:
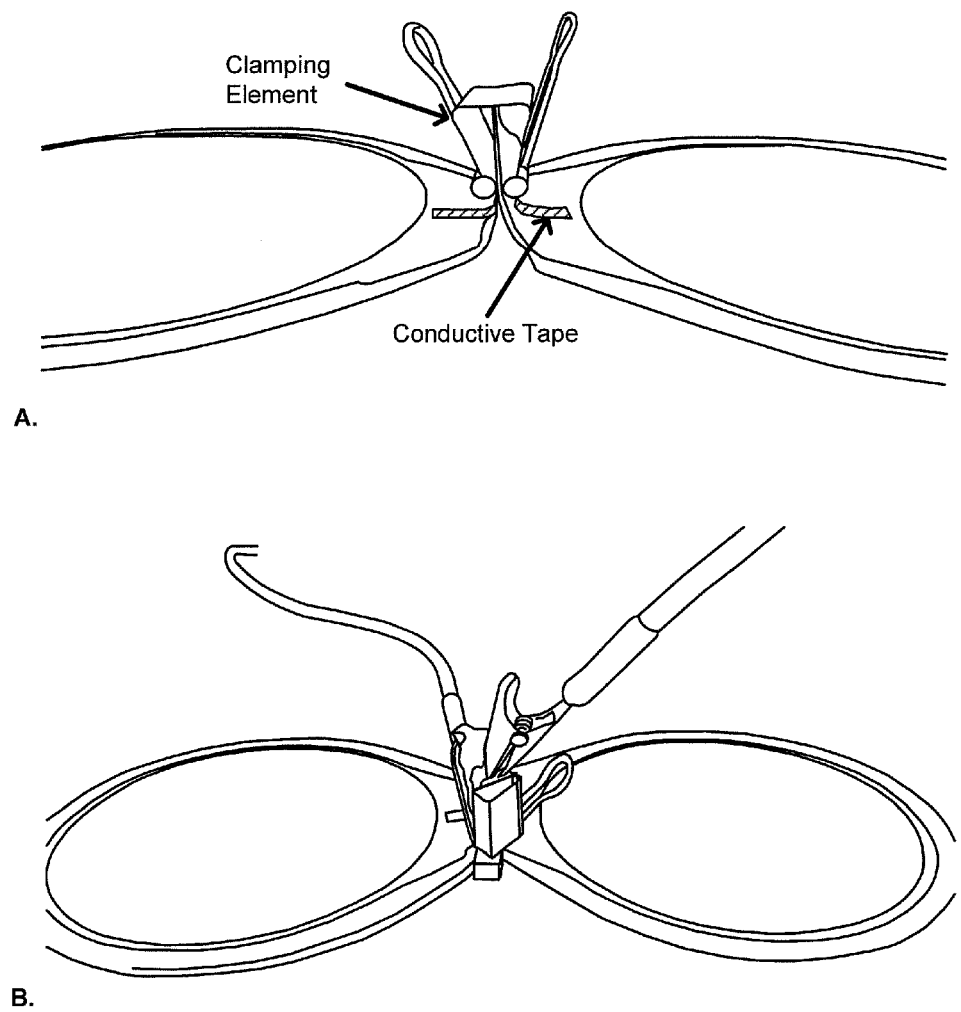
FIGS. 23(a) and (b) show a first and second flexible substrate connected using a folded edge interconnect with a clamping element and a conductive tape interconnect.

In a second embodiment, the first and second flexible substrates are as shown in FIG. 23. FIG. 23(a) shows a first flexible substrate mechanically connected to a second flexible substrate using a clip as a clamping element to press together a folded interconnect. In this second embodiment, the folded interconnect is folded toward the direction of light emission. In this second embodiment, electrical contact is made between a contact pad on the first flexible substrate and a contact pad on the second flexible substrate using a conductive tape interconnect that runs over the folded interconnect. FIG. 23(b) shows that when an anode pad on the first flexible substrate (on the left) and a cathode pad on the second flexible substrate (on the right) are connected by clips to an external power source, OLEDs on both first and second flexible substrates are illuminated. In this second embodiment, a folded interconnect and clamping element provide robust mechanical connection, while a conductive tape interconnect provides robust electrical connection. In this second embodiment, an OLED disposed on the first flexible substrate is connected in series with an OLED disposed on the second flexible substrate.

Figure 24:
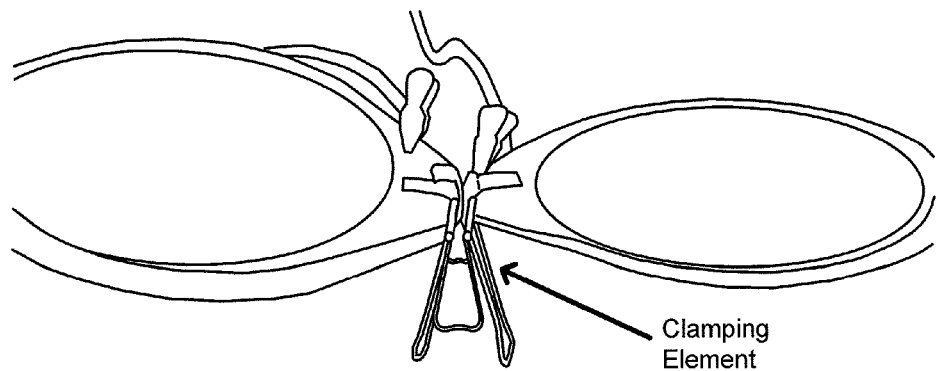
FIGS. 24(a) and (b) show a first and second flexible substrate connected using a folded interconnect with a clamping element.
Figure 24:
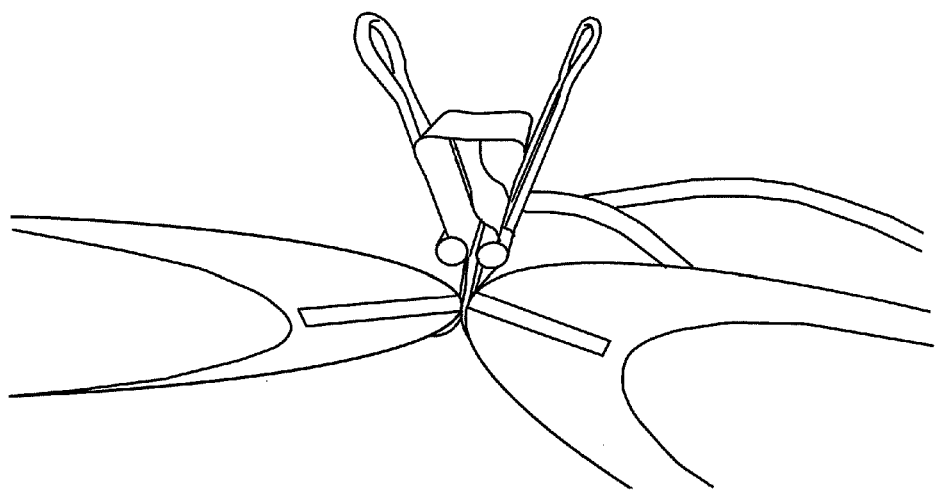

In a third embodiment, the first and second flexible substrates are as shown in FIG. 24. FIG. 24(a) shows a first flexible substrate mechanically connected to a second flexible substrate using a clip as a clamping element to press together a folded interconnect. In this third embodiment, the folded interconnect is folded away from the direction of light emission. This is a demonstration of the principle shown in FIG. 10. In this third embodiment, electrical contact is made by a direct connection between a contact pad on the first flexible substrate and a contact pad on the second flexible substrate, without the use of any connecting element. FIG. 24(b) shows that when an anode pad on the first flexible substrate (on the left) and a cathode pad on the second flexible substrate (on the right) are connected by clips to an external power source, OLEDs on both first and second flexible substrates are illuminated. In this third embodiment, a folded interconnect with a clip as a clamping element provides robust mechanical and electrical connection. In this third embodiment, an OLED disposed on the first flexible substrate is connected in series with an OLED disposed on the second flexible substrate.

Figure 25:
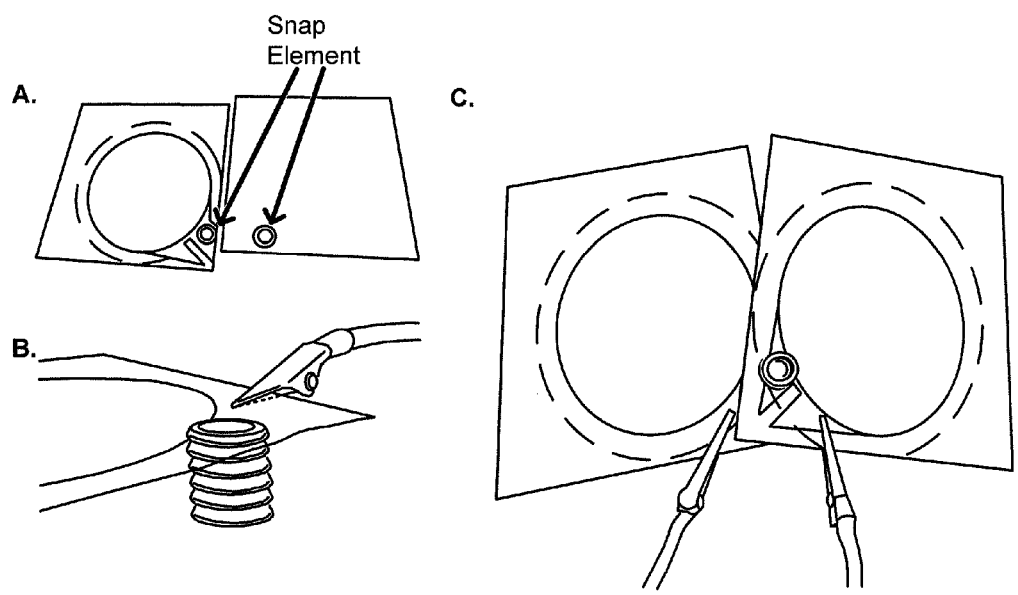
FIGS. 25(a-c) show a first and second flexible substrate connected using a snap connect interconnect.

In a fourth embodiment, the first and second flexible substrates are as shown in FIG. 25. FIG. 25(a) shows a first flexible substrate with a first half of a snap connect attached to a contact pad on the first flexible substrate. A second half of a snap connect is attached to a contact pad on the second flexible substrate. FIG. 25(b) shows first and second flexible substrates mechanically connected by the snap connect interconnect. FIG. 25(c) shows that when an anode pad on the first flexible substrate (on the left) and a cathode pad on the second flexible substrate (on the right) are connected by clips to an external power source, OLEDs on both first and second flexible substrates are illuminated. This demonstrates that the first and second flexible substrates are also electrically connected by the snap connect interconnect. In this fourth embodiment, a snap-connect interconnect provides robust mechanical and electrical connection. In this fourth embodiment, an OLED disposed on the first flexible substrate is connected in series with an OLED disposed on the second flexible substrate.

In a fifth embodiment, the first and second flexible substrates are as shown in FIG. 26. FIG. 26 shows a first flexible substrate mechanically connected to a second flexible substrate using multiple hook and eye interconnects. Multiple magnets are used as clamping elements to reinforce the mechanical connection. Contact pads on the first and second flexible substrates are electrically connected using conductive adhesive paste interconnects. When an anode pad on the first flexible substrate and a cathode pad on the second flexible substrate are connected by clips to an external power source, OLEDs on both first and second flexible substrates may illuminate. In this fifth embodiment, multiple hook and eye interconnects with a multiple magnets as clamping elements provide robust mechanical connection, while multiple conductive adhesive paste interconnects may provide robust electrical connection. In this fifth embodiment, OLEDs disposed on the first flexible substrate are connected in series with OLEDs disposed on the second flexible substrate.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A first device, comprising:
a plurality of flexible substrates, wherein the plurality of flexible substrates includes at least a first flexible substrate and a second flexible substrate, the first flexible substrate is a constituent part of at least one first flexible organic light emitting device (OLED), and the second flexible substrate is a constituent part of at least one second flexible OLED; and
at least one electrical interconnection between the first flexible substrate and the second flexible substrate, wherein the at least one electrical interconnection is not directly attached to a fixture and is:
a direct connection without a connecting element, where the at least one electrical interconnection is selected from the group consisting of a folded interconnect, an interlocked cut, a hook and eye system, and a conductive adhesive; or
an indirect connection through a connecting element, wherein the connecting element includes one or more of tape, conductive tape, a rivet, a hook and eye system, a snap-connect, or a clamping element; and the connecting element is not the first flexible substrate or the second flexible substrate.

2. The first device of claim 1, wherein the first flexible substrate is directly supported only by electrical interconnections with other flexible substrates in the plurality of flexible substrates.

3. The first device of claim 1, wherein a shape of the first flexible substrate is defined by:
mechanical properties of the plurality of flexible substrates; and
the at least one electrical interconnection between the first flexible substrate and the second flexible substrate.

4. The first device of claim 1, wherein the shape of the first device is defined by:
mechanical properties of the plurality of flexible substrates; and
the at least one interconnection between the first flexible substrate and the second flexible substrate.

5. The first device of claim 1, wherein the at least one electrical interconnection is the direct connection and further includes an adhesive, a soldered connection, or a welded connection.

6. The first device of claim 1, wherein the at least the first flexible substrate is adjacent to the second flexible substrate, one or more regions of the at least a first flexible substrate and one or more regions of the second flexible substrate are folded, and the one or more of the folded regions of the first flexible substrate are connected to the one or more of the folded regions of the second flexible substrate.

7. The first device of claim 1, wherein one or more regions of the at least the first flexible substrate includes a first contact pad, and one or more regions of the second flexible substrate includes a second contact pad, and the first contact pad is electrically connected to the second contact pad.

8. The first device of claim 1, wherein the first device has a three dimensional shape.

9. The first device of claim 1, wherein the plurality of the flexible substrates comprises metal foil, plastic, fabric, flexible glass, paper, or combinations thereof.

10. The first device of claim 9, wherein the first device has a bending length of about 1.0 cm to about 30.0 cm.

11. The first device of claim 9, wherein a flexural rigidity of the plurality of the flexible substrates is about 10-1 Nm to about 10-6 Nm.

12. The first device of claim 1, wherein the first flexible OLED is covered with a thin film encapsulation layer.

13. The first device of claim 12, wherein a hard coat layer is present on the thin film encapsulation layer.

14. The device of claim 1, wherein the device is at least one of: a flat panel display, a computer monitor, a television, a billboard, a light configured to illuminate, a light configured to signal, a heads up display, a fully transparent display, a flexible display, a laser printer, a telephone, a cell phone, a personal digital assistant, a laptop computer, a digital camera, a camcorder, a viewfinder, a micro-display, a vehicle, a large area wall, a theater screen, a stadium screen, or a sign.

* * * * *